United States Patent
Senaratne et al.

(10) Patent No.: US 9,647,646 B2
(45) Date of Patent: May 9, 2017

(54) SYSTEMS AND METHODS FOR GAIN AND OFFSET CONTROL

(71) Applicant: QUALCOMM Incorporated, San Diego, CA (US)

(72) Inventors: Rajapaksa Senaratne, San Diego, CA (US); Koorosh Akhavan, San Diego, CA (US); Le Nguyen Luong, San Diego, CA (US); Eunmo Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 79 days.

(21) Appl. No.: 14/550,682

(22) Filed: Nov. 21, 2014

(65) Prior Publication Data

US 2015/0303904 A1  Oct. 22, 2015

Related U.S. Application Data

(60) Provisional application No. 61/982,737, filed on Apr. 22, 2014.

(51) Int. Cl.
| | | |
|---|---|---|
| *H03L 5/00* | (2006.01) | |
| *H03K 5/003* | (2006.01) | |
| *H03G 3/30* | (2006.01) | |

(52) U.S. Cl.
CPC ........... *H03K 5/003* (2013.01); *H03G 3/3078* (2013.01)

(58) Field of Classification Search
CPC ..... H03M 1/12; H03M 1/1215; H03M 1/0624
See application file for complete search history.

(56) References Cited

U.S. PATENT DOCUMENTS

| | | | |
|---|---|---|---|
| 6,654,593 | B1 | 11/2003 | Simmons et al. |
| 7,190,748 | B2 | 3/2007 | Kim et al. |
| 7,885,627 | B2 | 2/2011 | Lee et al. |
| 8,548,105 | B2 | 10/2013 | Rimini |
| 2006/0068733 | A1 | 3/2006 | Wang et al. |
| 2013/0127529 | A1 | 5/2013 | Morita |

(Continued)

FOREIGN PATENT DOCUMENTS

| | | |
|---|---|---|
| EP | 1517440 A2 | 3/2005 |
| EP | 1538744 A1 | 6/2005 |

OTHER PUBLICATIONS

ISO/IEC 14443-1, Identification Cards—Contactless Integrated Circuit(s) Cards—Proximity Cards, Part 1: Physical Characteristics, Jun. 15, 2008, pp. 12.

(Continued)

*Primary Examiner* — Sibin Chen
(74) *Attorney, Agent, or Firm* — Austin Rapp & Hardman

(57) ABSTRACT

A method for setting an initial gain and an initial offset for an automatic gain and offset controller (AGOC) is described. The method includes determining a gain level at which a signal does not under-saturate or over-saturate an input to an analog-to-digital converter (ADC) by performing a binary search over a fixed set of gain levels while an offset is fixed. The method also includes determining an offset correction to bring an unmodulated carrier level at an output of the ADC to a target level. The method may also include updating the gain and the offset in response to changes in a signal level.

30 Claims, 16 Drawing Sheets

(56) References Cited

U.S. PATENT DOCUMENTS

2013/0237150 A1  9/2013  Royston
2014/0073278 A1* 3/2014  Fan ................... H03G 3/3078
                                                        455/253.2

OTHER PUBLICATIONS

NFC Forum: "NFC Digital Protocol, Technical Specification, Digital 1.0", NFC Forum, Nov. 17, 2010, pp. 1-175, XP002712429, Wakefield, MA, USA, Retrieved from the Internet: URL:http://cwi.unik.no/images/NFC_forum_digital_protocol.pdf [retrieved on Sep. 6, 2013], p. 25-p. 34.
International Search Report and Written Opinion—PCT/US2015/021684—ISA/EPO—Jun. 18, 2015.

\* cited by examiner

SYSTEMS AND METHODS FOR GAIN AND OFFSET CONTROL

RELATED APPLICATIONS

This application is related to and claims priority from U.S. Provisional Patent Application Ser. No. 61/982,737, filed Apr. 22, 2014, for "Automatic Gain and Offset Controller for Target Receiver of Near Field Communication."

TECHNICAL FIELD

The present disclosure relates generally to electronic devices. More specifically, the present disclosure relates to systems and methods for setting the initial gain and offset for an automatic gain and offset controller. The present disclosure also relates to systems and methods for updating the gain and offset for an automatic gain and offset controller.

BACKGROUND

The use of electronic devices has become common. In particular, advances in electronic technology have reduced the cost of increasingly complex and useful electronic devices. Cost reduction and consumer demand have proliferated the use of electronic devices such that they are practically ubiquitous in modern society. As the use of electronic devices has expanded, so has the demand for new and improved features of electronic devices. More specifically, electronic devices that perform new functions and/or that perform functions faster, more efficiently or with higher quality are often sought after.

Some electronic devices (e.g., smartphones) transmit wireless signals. For example, the wireless signals may be utilized to communicate with other electronic devices. For instance, the wireless signals may convey voice information or data. In some implementations, the wireless communication may be over an inductive coupling between devices. The size of the antennas and the mobility (i.e., relative motion) of the transmitter and receiver may affect the dynamic range of the wireless signals. Thus, system and methods for setting the initial gain and offset and updating the gain and offset for an automatic gain and offset controller may be beneficial.

SUMMARY

A method for setting an initial gain and an initial offset for an automatic gain and offset controller (AGOC) is described. The method includes determining a gain level at which a signal does not under-saturate or over-saturate an input to an analog-to-digital converter (ADC) by performing a binary search over a fixed set of gain levels while an offset is fixed. The method also includes determining an offset correction at the completion of binary search to bring an unmodulated carrier level at the ADC output to a target level.

The fixed set of gain levels may be logarithmically spaced. The fixed set of gain levels may be determined to have sufficient overlap to provide tolerance to gain variation.

Determining the offset correction may include determining a difference of the unmodulated carrier level and the target level. The offset may be corrected by adjusting its value by the difference.

The initial setting of the gain and the offset may take place when an input carrier signal at a receiving antenna is unmodulated. The AGOC may be for a near field communication (NFC) target receiver.

The method may also include updating the gain and the offset in response to changes in a signal level. Updating the gain and the offset may include constantly adjusting the offset to maintain the unmodulated carrier level at the ADC output at the target level. Updating the gain and the offset may also include determining whether a gain change is needed and executing the gain change along with a proactive or reactive offset change. Updating the gain and the offset may take place when an input carrier signal at a receiving antenna is modulated or unmodulated.

Constant offset adjustment may include periodically determining the difference between the unmodulated carrier level at the ADC output and the target level and correcting the offset by that amount. Determining whether the gain change is needed may include determining a deviation of the updated offset from an initial offset. If the deviation is above a first offset deviation threshold, the gain may be decreased. If the deviation is below a second offset deviation threshold, the gain may be increased.

An electronic device for setting an initial gain and an initial offset for an AGOC is also described. The electronic device includes a processor, memory in electronic communication with the processor and instructions stored in the memory. The electronic device may determine a gain level at which a signal does not under-saturate or over-saturate an input to an ADC by performing a binary search over a fixed set of gain levels while an offset is fixed. The electronic device may also determine an offset correction to bring an unmodulated carrier level at an output of the ADC to a target level.

An apparatus for setting an initial gain and an initial offset for an AGOC is also described. The apparatus includes means for determining a gain level at which a signal does not under-saturate or over-saturate an input to an ADC by performing a binary search over a fixed set of gain levels while an offset is fixed. The apparatus also includes means for determining an offset correction to bring an unmodulated carrier level at an output of the ADC to a target level.

A computer-program product operable to set an initial gain and an initial offset for an AGOC is also described. The computer-program product includes a non-transitory computer-readable medium having instructions thereon. The instructions include code for causing an apparatus to determine a gain level at which a signal does not under-saturate or over-saturate an input to an ADC by performing a binary search over a fixed set of gain levels while an offset is fixed. The instructions also include code for causing the apparatus to determine an offset correction to bring an unmodulated carrier level at an output of the ADC to a target level.

DETAILED DESCRIPTION

Figure 1:
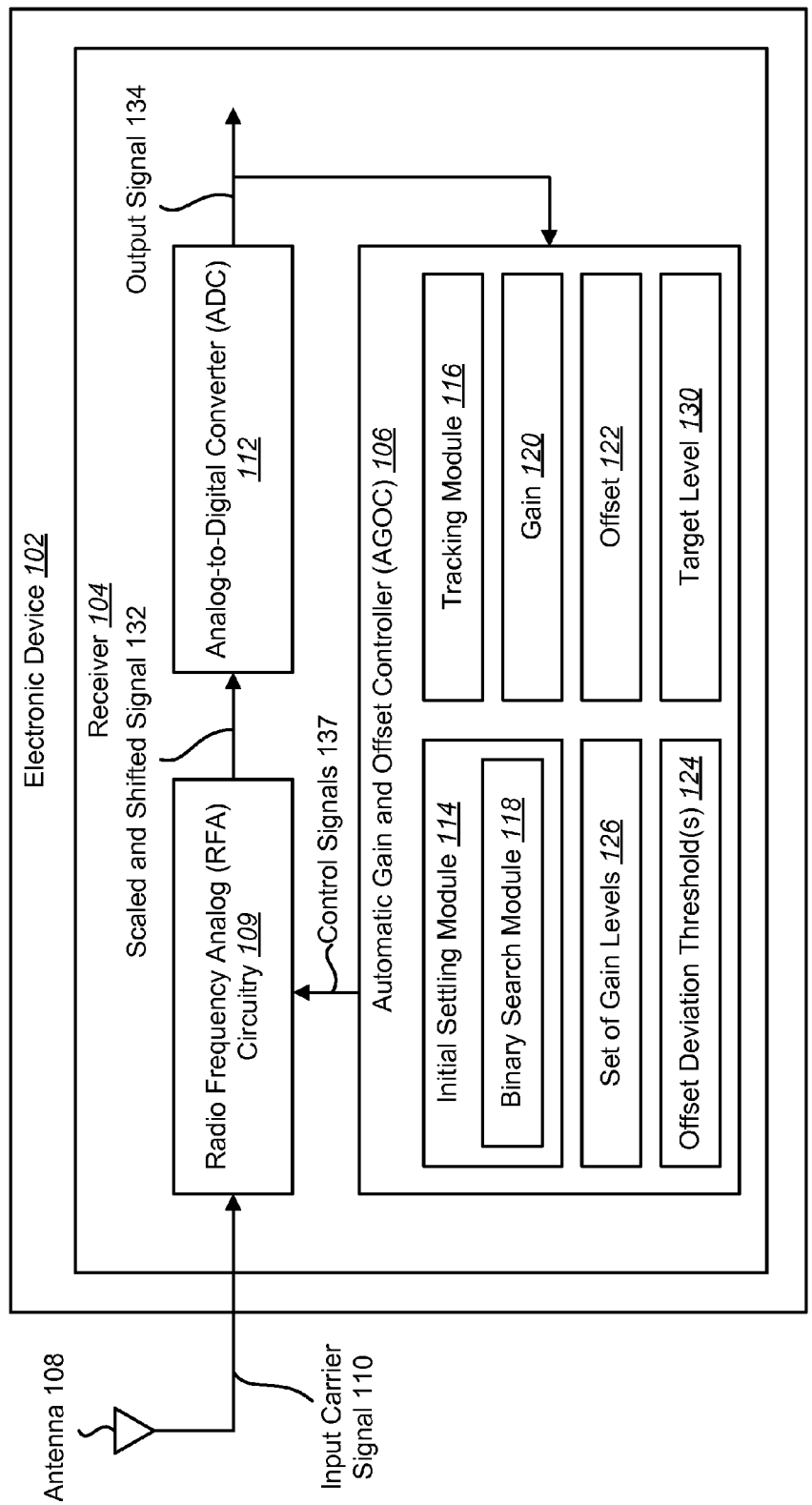
FIG. 1 is a block diagram illustrating one configuration of an electronic device in which systems and methods for setting an initial gain and an initial offset for an automatic gain and offset controller (AGOC) may be implemented.

The systems and methods disclosed herein may be applied to communication devices that communicate wirelessly and/or that communicate using a wired connection or link. For example, some communication devices may communicate with other devices using an Ethernet protocol. In another example, some communication devices may communicate with other devices using wireless communication. In one configuration, the systems and methods disclosed herein may be applied to a communication device that communicates with another device using an induction-based communication technology. One implementation of an induction-based communication technology is near field communication (NFC).

The systems and methods described herein may enable setting the initial gain and offset for an automatic gain and offset controller (AGOC) that controls gain levels and offset voltages applied to a signal in the radio frequency analog (RFA) stages of a receiving device. The systems and methods described herein may also enable updating the gain and the offset in response to changes in a signal level as measured from digital stages of the receiving devices, for example, at the analog-to-digital converter (ADC) output.

The AGOC may have two functions: (1) determining the initial gain and offset settings to bring a signal within the input range of an ADC; and (2) constantly adjusting the gain and offset settings to compensate for signal-strength variation due to mobility so that the ADC input signal level remains within acceptable range. These two functions may be referred to as AGOC initial setting and AGOC tracking, respectively.

The AGOC may facilitate an NFC target receiver to handle the wider dynamic range requirements for supporting small-antennas and target mobility. With small-antenna support becoming the new norm for NFC, the dynamic range of the input signal that a target receiver needs to support is significantly increasing. Consequently, neither a fixed universal gain/attenuation setting in the RF receiver chain nor analog-only gain control based on voltage/current feedback circuits is viable for next generation of NFC receivers. This means that the digital modem should generate control signals for the attenuator and gain stages in the receiver's RF chain.

Mobility (i.e., the relative motion of the transmitter and the receiver) affects the amount of transmit-receive antenna coupling and causes the signal amplitude at the receiver input to vary within an NFC transaction, not just between successive packet reception but even during the reception of a data packet. This means that when generating the control signals, the capability to track and compensate for signal-strength variation due to mobility is beneficial.

The modulation depth of the modulated carrier in NFC could range from as low as 13% to as high as 100%, and for successful demodulation, the modulated signal corresponding to that depth should fall within the ADC input range after being scaled down/up by the gain/attenuator stages. Therefore, in order to keep the modulated signal within the ADC input range, the AGOC should also control the effective offset voltage applied in the RFA chain. Offset control is especially important if a simple slicer-based algorithm is used for demodulation. The systems and methods described herein implement an AGOC to facilitate small-antenna and mobility support. The AGOC state machine updates the attenuator/gain and offset control signals fed back to the RF stages based on the unmodulated carrier level estimated by using the ADC output.

Various configurations are now described with reference to the Figures. The systems and methods as generally described and illustrated in the Figures herein could be arranged and designed in a wide variety of different configurations. Thus, the following more detailed description of several configurations, as represented in the Figures, is not intended to limit scope, as claimed, but is merely representative of the systems and methods.

FIG. 1 is a block diagram illustrating one configuration of an electronic device 102 in which systems and methods for setting an initial gain 120 and an initial offset 122 for an automatic gain and offset controller (AGOC) 106 may be implemented. Examples of the electronic device 102 include wireless communication devices, cellular phones, smartphones, tablet devices, voice recorders, digital cameras, still cameras, camcorders, gaming systems, laptop computers, etc. Each component of the electronic device 102 may be implemented in hardware (e.g., circuitry) or a combination of hardware and software (e.g., a processor with executable instructions stored in memory).

The electronic device 102 may include a transceiver that includes a receiver 104. In one implementation, the receiver 104 may be used in induction-based communication. For example, the receiver 104 may be a near-field communication (NFC) target receiver. During certain NFC transactions, a listening device may function as a "target," which is a role defined in the NFC standards. In one configuration, the systems and methods described herein may describe a receiver 104 of an NFC device functioning as a "target."

The electronic device 102 may establish radio communication with another wireless communication device. In the case of NFC communication, the electronic device 102 may establish communication with a "poller" or NFC polling device using NFC protocols. The electronic device 102 may receive an input carrier signal 110 via one or more antenna 108. The input carrier signal 110 may be modulated or unmodulated.

The receiver 104 may include RFA circuitry 109. The RFA circuitry 109 may receive and condition the input carrier signal 110. This conditioning may include signal scaling and level shifting to allow the 'useful signal' (i.e., the portion of the signal that contains the information the receiver needs to extract) to pass through an ADC 112 having a narrow dynamic range without incurring significant signal quantization loss.

The RFA circuitry 109 may provide a scaled and shifted signal 132 to the ADC 112. The RFA circuitry 109 may produce the scaled and shifted signal 132 by applying a gain 120 and a voltage offset 122 to the input carrier signal 110. The RFA circuitry 109 may perform additional signal conditioning to the input carrier signal 110, for example, envelope detection, filtering and delay compensation.

The receiver 104 may include an automatic gain and offset controller (AGOC) 106. The AGOC 106 may determine the gain 120 and the voltage offset 122 (also referred to as offset voltage) applied by the RFA circuitry 109 to the input carrier signal 110. This gain 120 scales the output signal 134 from the ADC 112 so that any amplitude modulation in the signal can be reliably detected. The offset 122 voltage brings the output signal 134 level when the carrier is unmodulated to a target level 130. The output signal 134 when the carrier is unmodulated may also be referred to as "unmodulated level" or "DC value." The AGOC 106 may provide one or more control signals 137 to the RFA circuitry 109. The control signals 137 may control programmable gain and/or attenuator stages in the RFA circuit 109 to provide the gain 120, and a digital-to-analog converter (DAC) in the RFA circuitry 109 may be controlled to provide the offset 122 voltage.

The ADC 112 may have a relatively narrow dynamic range compared to the input range. The AGOC 106 may provide gain 120 control to ensure that a signal (e.g., the scaled and shifted signal 132) provided to the ADC 112 does not fall below or above the ADC 112 input range, in other words, that the ADC 112 input does not "under-saturate" or "over-saturate" the ADC 112. Therefore, the AGOC 106 may control the RFA circuitry 109 gain 120 and voltage offset 122 to bring the scaled and shifted signal 132 at the ADC 112 input within the dynamic range of the ADC 112 for a range of signal voltages at the antenna 108.

The AGOC 106 may perform at least two functions, as described above: (1) determining the initial gain 120 and offset 122 voltage settings to bring a signal within the input range of an ADC 112; and (2) constantly adjusting the gain 120 and offset 122 voltage settings to compensate for signal-strength variation due to mobility so that the ADC 112 input signal level remains within acceptable range. These two functions may be referred to as AGOC initial setting and AGOC tracking, respectively.

An initial setting module 114 may implement the AGOC initial setting function. The initial setting module 114 may set an initial gain 120 and an initial offset 122 for the AGOC 106. In one configuration, the initial setting module 114 may include a binary search module 118 to determine a gain 120 level at which the signal (e.g., scaled and shifted signal 132) does not under-saturate or over-saturate the ADC 112. The setting of the initial gain 120 and the initial offset 122 may take place when an input carrier signal 110 at the receiving antenna 108 is unmodulated.

The binary search module 118 may conduct a "binary search" over the available gain levels 126 to find a gain level 126 that scales an unmodulated input carrier signal 110 after envelope detection so that the scaled and shifted signal 132 falls within the ADC 112 input range. An example of a binary search algorithm is described in connection with FIG. 14. Each node in the "tree" structure represents a gain level. The binary search algorithm may start with the "root" of the tree (i.e., g8); then it may estimate DC value to assert if the ADC 112 is under-saturated or over-saturated. If the ADC 112 is under-saturated (indicated by label "U" in FIG. 14), it may deduce that gain 120 is "too low," which means, supposing the gain levels 126 descend from g1 to g15, that gains g8 through g15 are not possible candidates. The algorithm may therefore switch to "left sub-tree" of node g8 and proceed as before. Likewise, if over-saturation (indicated by label "O" in FIG. 14) is asserted, the algorithm should pick the other sub-tree, i.e., "right sub-tree" supposing descending gain levels 126.

If gain levels 126 are optimally designed for a binary search, the offset 122 voltage does not have to be varied during the search, and a predetermined initial offset 122 voltage may be applied throughout the binary search. In other words, the binary search module 118 may perform a binary search over a fixed set of gain levels 126 while an offset 122 voltage is fixed. If gain levels 126 are not properly designed, the offset 122 voltage may have to be changed per gain-level 126 basis during the search. In either case, binary search allows the search algorithm to converge fast to pick an appropriate initial gain 120 out of the set of gain levels 126.

In one configuration optimized for binary search, the set of gain levels 126 are logarithmically spaced by design. With such gain levels 126, the binary search module 118 may keep the offset 122 voltage fixed throughout the binary search. Since the actual gain levels 126 in a hardware RFA implementation may vary significantly from their nominal gain values 120, the fixed set of gain levels 126 may have sufficient overlap built-in to provide tolerance to such gain 120 variation. It should be noted that nominal gain 120 does not have any variation; but corresponding actual gain 120 (when implemented in silicon, for example) may vary with process, voltage and temperature changes.

Since this search brings the scaled and shifted signal 132 within the ADC 112 input range, the unmodulated level at the ADC 112 output may be measureable at its completion. At that point, the offset 122 voltage may be adjusted to bring the unmodulated level to the preset target level 130. This step may be interpreted as an "offset correction."

In one configuration, the initial setting module 114 may determine the offset 122 correction as a difference of the unmodulated carrier level at the output of the ADC 112 (e.g., output signal 134) and the target level 130. Applying this correction to the offset 122 fed back as a control signal 137 to the RFA circuitry 109 causes the unmodulated level to shift to the target level 130.

A tracking module 116 may implement the AGOC tracking function. Mobility conditions (i.e., the change of relative position and orientation of the target electronic device 102 with respect to the polling device) may cause the received signal strength to vary. Reduced signal strength may affect the demodulation sensitivity whereas increased signal strength may cause "useful" portion of modulated carrier to get clipped. To avoid these undesired effects of mobility, the tracking module 116 may update the gain 120 and the offset 122 in response to changes in the signal (i.e., input carrier signal 110) level.

In NFC, the target remains active only while it receives a sufficiently strong electromagnetic field from a poller, and as a result, an unmodulated or modulated carrier signal may be present at all times (with only modulated carrier conveying useful information packets). Since NFC packets do not have preambles (i.e., a specific pattern to help channel estimation, packet acquisitioning, etc.) long enough to perform initial gain 120 and offset 122 setting, the AGOC 106 may use the unmodulated signal to set the initial gain 120 and offset 122 right after its activation and continuously update the set gain 120 and offset 122 values until the actual packet is completely received. Therefore, gain 120 and offset 122 updates may take place when an input carrier signal 110 at the receiving antenna 108 is modulated or unmodulated.

AGOC tracking may start with an unmodulated level already set close to its target level 130 at the ADC 112 output. In one approach, the tracking module 116 may simply keep adjusting the offset 122 (e.g., offset voltage) to maintain the unmodulated level unchanged even when mobility conditions cause the received signal strength to vary. For example, in one approach, when unmodulated level at the ADC 112 output deviates from the target level 130 offset 122 could be adjusted by the same amount; in another approach offset 122 could be adjusted only when this deviation exceeds a predetermined threshold. It should be noted that this threshold is not same as the offset deviation threshold 124, which is the deviation of the offset 122 from the initial offset 122 (used during the binary search, for example).

These offset 122 adjustments may be constantly performed to compensate for the unmodulated level shift due to mobility. However, indefinite offset 122 adjustment may be neither feasible nor desirable. As the offset 122 deviates from the initial value of the offset 122 due to successive adjustments, it may become increasingly more likely that the received input carrier signal 110 is attenuated too much or too little so as to make the modulation depth (or the amount of signal saturation) undesirable. It should be noted that this concern may be valid even before the start of a modulated carrier.

In another approach, the absolute deviation of the offset 122 from the initial offset 122 may be interpreted as an indication of the appropriateness of the selected gain 120 for the input carrier signal 110 level at the antenna 108 output. When the offset 122 deviation exceeds a predetermined offset deviation threshold 124, the tracking module 116 may assert the need of a gain 120 change. The positive or negative direction of the offset 122 deviation may indicate whether a gain 120 increment or decrement is needed.

In yet another approach, two offset deviation thresholds 124 may be used along with the offset 122 deviation to determine whether gain 120 should be incremented, decremented or kept unchanged. For example, the tracking module 116 may decrease the gain 120 if the deviation is above a first offset deviation threshold 124. The tracking module 116 may increase the gain 120 if the deviation is below a second offset deviation threshold 124.

Updating gain 120 may cause the signal level at the ADC 112 output to shift up or down because the chosen offset 122 based on the previous gain 120 level could be too small or too high. In one approach, the tracking module 116 may reactively adjust the offset 122 (afterwards) and bring the signal level back to its original value. In another more proactive approach, which could be more useful where abrupt signal level changes might affect the receiver performance, the tracking module 116 may simultaneously adjust the offset 122 and gain 120 to minimize the shift in the signal level.

To summarize, in general, AGOC tracking may adjust the offset 122 to keep the unmodulated level steady. Furthermore, AGOC tracking may increment/decrement the gain 120 when the offset 122 deviation is excessive, and each gain 120 change may accompany a reactive or proactive offset 122 adjustment. By repeated offset 122 and gain-offset adjustment, the tacking module 116 may enable the receiver to support mobility.

The described systems and methods may generate the control signals 137 for attenuator, gain, and offset stages in the target receiver 104 RF chain, to keep the modulated signal within the input range of the ADC 112 irrespective of the antenna 108 size and mobility. By controlling a compatible RF stage, the described systems and methods allow an existing digital modem (e.g., receiver 104) design to support mobility and to function with a wider input-signal range.

Figure 2:
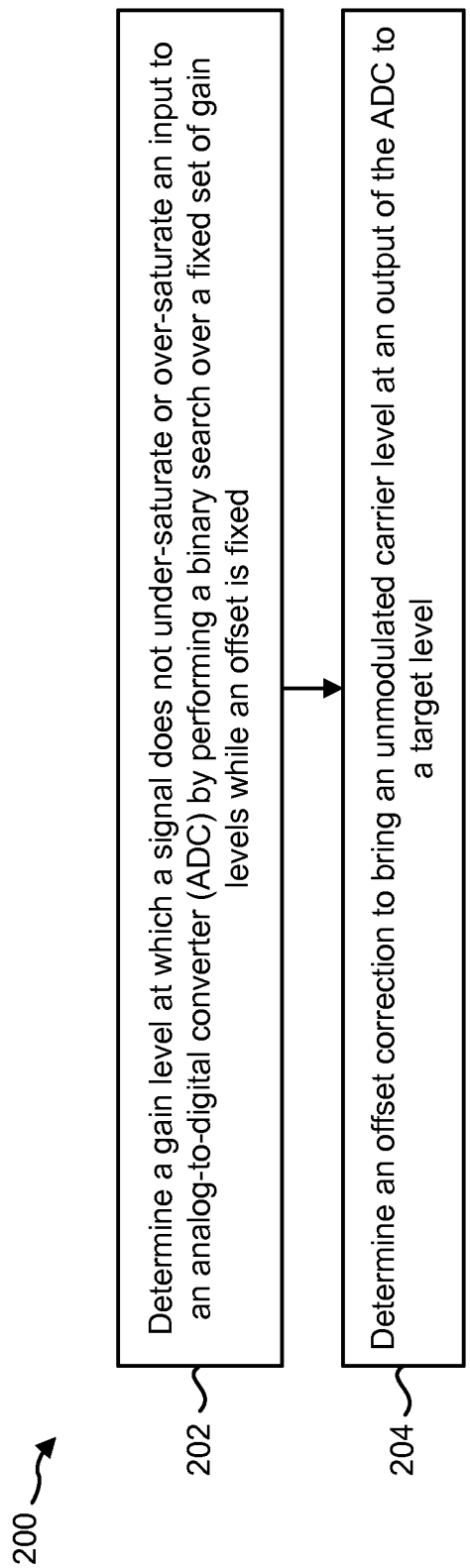
FIG. 2 is a flow diagram illustrating a method for setting an initial gain and an initial offset for an AGOC.

FIG. 2 is a flow diagram illustrating a method 200 for setting an initial gain 120 and an initial offset 122 for an AGOC 106. The method 200 may be implemented by an electronic device 102 that includes an AGOC 106. The electronic device 102 may receive an unmodulated input carrier signal 110. For example, the electronic device 102 may receive the unmodulated input carrier signal 110 during NFC communication.

The described AGOC initial setting method 200 may bring the unmodulated level at the ADC 112 output to its target level 130 with a minimal worst-case number of iterations. This method 200 may require no prior knowledge of the signal-voltage at the antenna 108 output and may only assume that signal under-saturation and over-saturation at the ADC 112 input could be reliably detected from the ADC 112 output. Such method 200 may be implemented in two phases: (i) a search phase to find a suitable gain 120 level and (ii) a subsequent offset 122 adjustment phase to appropriately shift the unmodulated level at the ADC 112 output to a preset target level 130.

The electronic device 102 may determine 202 a gain 120 level at which a signal (e.g., the scaled and shifted input carrier signal 132) does not under-saturate or over-saturate the input to the ADC 112. The ADC 112 may have a relatively narrow dynamic range compared to the input range. The electronic device 102 may perform gain 120 control to ensure that the signal provided to the ADC 112 does not under-saturate or over-saturate the input to the ADC 112.

The electronic device 102 may apply a binary search over the available set of gain levels 126 to find a gain 120 level that scales an unmodulated input carrier signal 110 (unmodulated level) to fall within the ADC 112 input range after being shifted. This shifting may be achieved by a predetermined initial offset 122 voltage applied during the binary search. In other words, the electronic device 102 may perform a binary search over a fixed set of gain levels 126 while an offset 122 correction is fixed.

In one configuration, the fixed set of gain levels 126 are logarithmically spaced. With logarithmically spaced gain levels 126, the electronic device 102 may keep the offset 122 correction fixed during the binary search. An example of a binary search is described in connection with FIG. 14. The fixed set of gain levels 126 may have sufficient overlap to provide tolerance to gain 120 variation.

The search phase may select a suitable gain 120 (i.e., a level that guarantees a sufficient unmodulated-to-low level swing within the ADC 112 input range). This approach may have to systematically cover an entire set of gain levels 126 because (i) there is no prior information about the unmodulated level, and (ii) an output signal 134 may not be measured until the correct gain 120 level is found (only the direction of saturation may be found). However, a linear search across all gain 120 levels may be unacceptably slow.

The convergence rate may be improved by enforcing the gain levels 126 to be monotonic. For example, the gain levels 126 may descend in magnitude as the gain 120 index increases. In another example, the gain levels 126 may ascend in magnitude as the gain 120 index increases.

Since two conditions—ADC 112 under-saturation and over-saturation—may be detected, a binary search, which has logarithmic complexity in time, may minimize the worst-case search time. When applied with a suitably calculated initial offset 122, the descending gain levels 126 may partition the signal-voltage range at the antenna 108 output. As described below, logarithmically spaced gain levels 126 may be used with the same initial offset 122 to form such partition. Such gain-level design for the AGOC 106 may also ensure that the binary search may be conducted while using the same initial offset 122. This logarithmically spaced gain level design 126 may not only improve the convergence time but also may reduce the hardware overhead.

The electronic device 102 may determine 204 an offset 122 correction to bring an unmodulated carrier level at an output of the ADC 112 to a target level 130. Since the binary search brings the unmodulated level at the RFA circuitry 109 output within the ADC 112 input range, the unmodulated level at the ADC 112 output may be measureable at the search completion. At that point, an additional offset 122 voltage adjustment may be made to bring the unmodulated level to the preset target level 130.

In one configuration, the electronic device 102 may measure or estimate the unmodulated carrier level at the output of the ADC 112 (e.g., output signal 134) and determine how much it differs from the target level 130. Then the electronic device 102 may correct the offset 122 by the difference. The corrected offset 122 will produce the corresponding voltage shift in the RFA circuitry 109 when fed back from the AGOC 106 as a control signal 137. The RFA circuitry 109 may employ a DAC stage to generate the voltage shift corresponding to any given offset 122.

Different techniques may be used to measure/estimate the unmodulated carrier level at the ADC 112 output including averaging successive samples and filtering. Sophisticated algorithms may track the unmodulated and modulated carrier segment to maintain an accurate estimate of the unmodulated carrier level even when the carrier is modulated.

Figure 14:
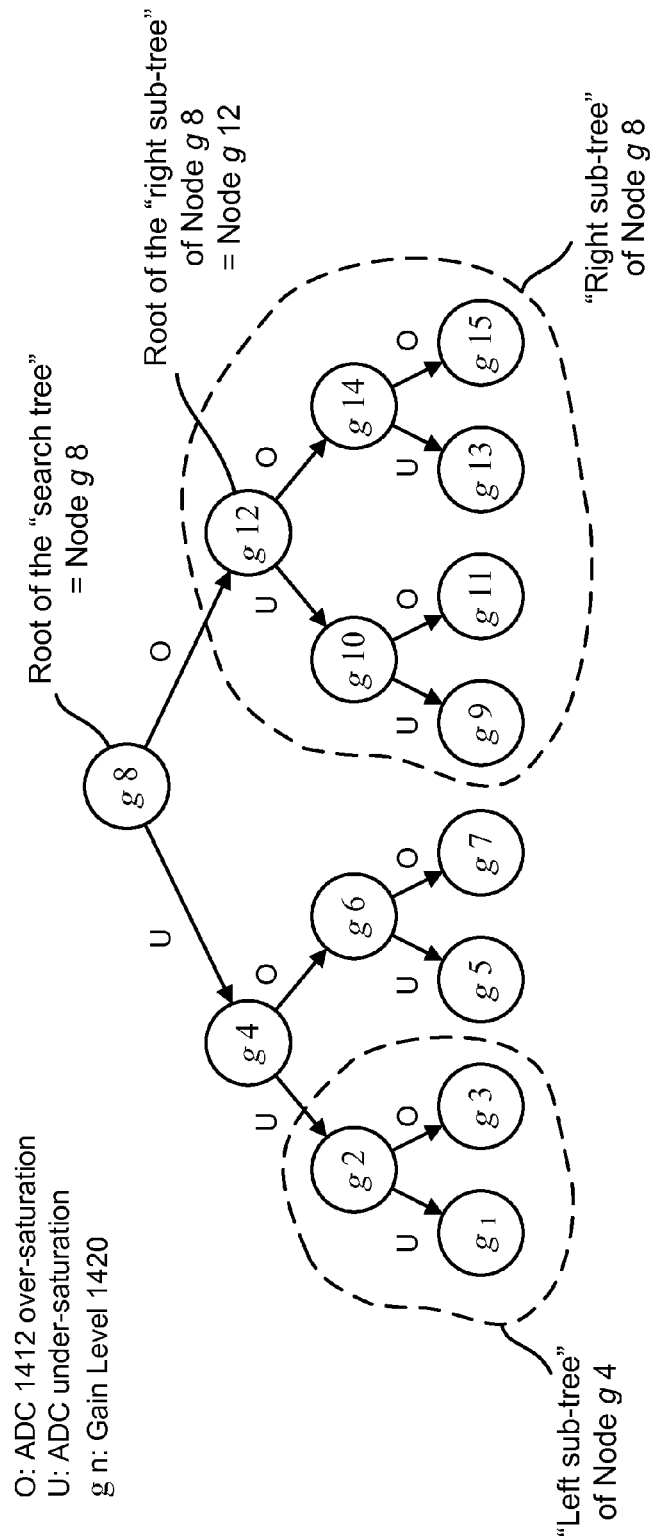
FIG. 14 is a diagram illustrating a binary search tree corresponding to 15 gain levels.

Since a binary search tree dictates the sequence of gain 120 levels applied during successive search steps (e.g., as shown in FIG. 14, a search over seven gain levels 126 always starts with the fourth gain 120 level) any prior knowledge of suitable gain 120 or offset 122 would be discarded during the search phase. Therefore, in configurations where mobility is not significant, the electronic device 102 may forego this phase for successive packets. Supposing AGOC tracking is enabled, a tracking module 116 may pick the correct gain 120 and offset 122 without the need for searching over all the gain levels 126.

In one configuration, the gain levels 126 may be designed to have overlaps. For example, 3 decibel (dB) gain spacing may result in a 50% overlap (in the log scale) of voltage ranges supported by successive gain 120 levels. With the hysteresis introduced by these overlaps, the method 200 may accurately converge even when there is mobility. However, when the mobility is severe, the binary search may fail because the binary search eliminates half of the gain 120 levels from consideration every time. Still, the binary search would end at a reasonably close gain 120 level, and the AGOC tracking phase would eventually bring the unmodulated level at the ADC 112 output to its target level 130.

Figure 3:
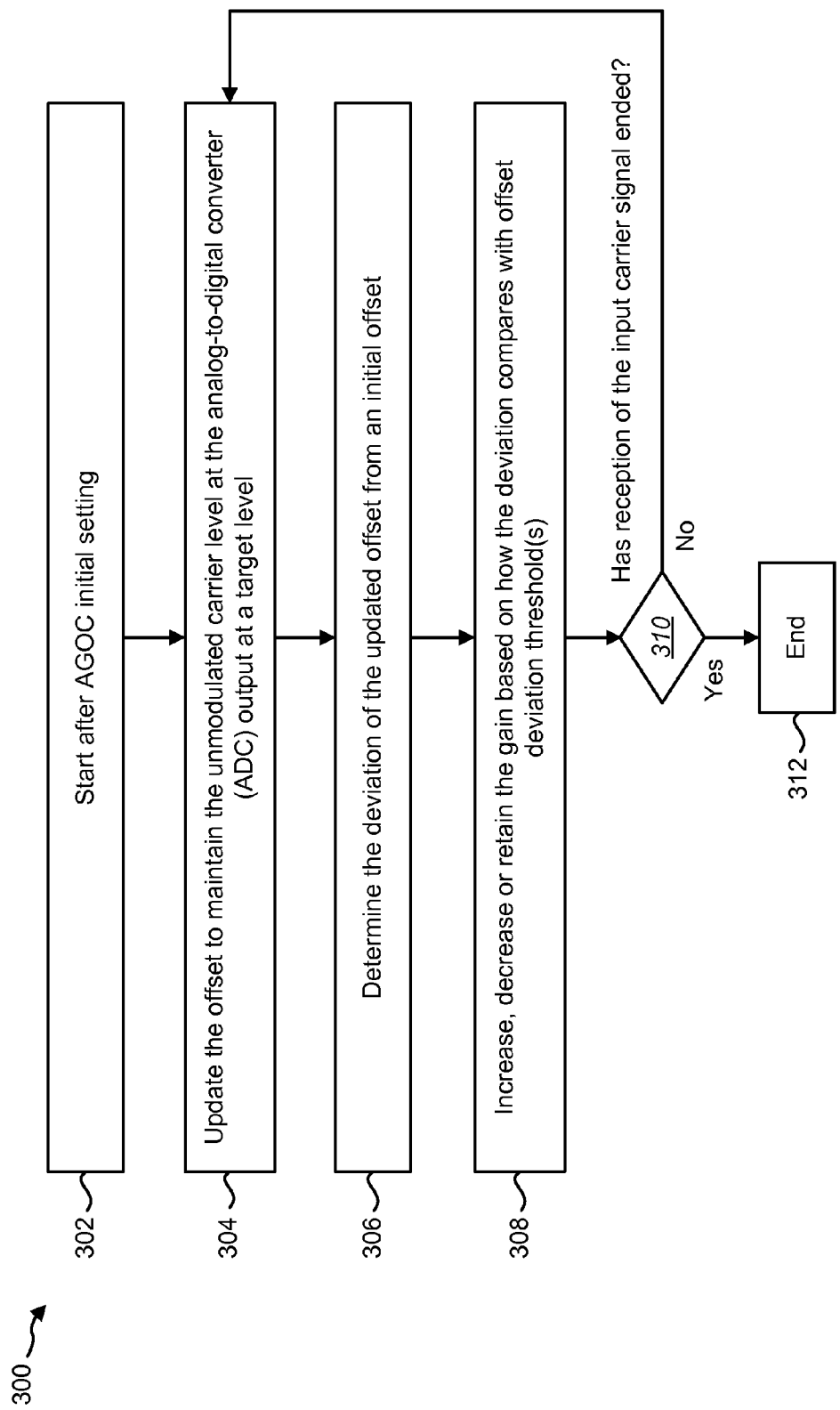
FIG. 3 is a flow diagram illustrating a method for updating the gain and the offset in response to changes in a signal level.

FIG. 3 is a flow diagram illustrating a method 300 for updating the gain 120 and the offset 122 in response to changes in a signal level. The method 300 may be implemented by an electronic device 102 that includes an AGOC 106. Tracking may be achieved through offset 122 control, or when necessary, through simultaneous gain 120 and offset 122 control.

The electronic device 102 may start 302 tracking after an AGOC initial setting. The electronic device 102 may receive an unmodulated input carrier signal 110. Mobility conditions may cause the received signal strength to vary. Therefore, the electronic device 102 may update the gain 120 and the offset 122 in response to changes in the signal (i.e., input carrier signal 110) level. The electronic device 102 may start with an unmodulated level already set close to its target level 130 at the ADC 112 output. For example, the initial gain 120 and initial offset 122 may be set as described in connection with FIG. 2.

The absolute offset 122 deviation may indicate the appropriateness of the selected gain 120 for the input carrier signal 110 level at the antenna 108 output. When the unmodulated level deviates from the target level 130, the electronic device 102 may update 304 the offset 122 to maintain the unmodulated carrier level at the ADC 112 output at the target level 130. Constant offset 122 adjustment until the end of reception may fully compensate for the unmodulated level shift resulting from mobility. However, if offset 122 deviation (from the initial offset 122) due to successive updates is large, the effect of mobility could be too severe to be countered with only offset changes; in such cases, gain 120 changes could be required.

The electronic device 102 may determine whether a gain 120 change is needed. The electronic device 102 may determine 306 a deviation of an updated offset 122 from an initial offset 122. The electronic device 102 may compare 308 this deviation with offset deviation thresholds 124 to determine if a gain 120 change is needed. For example, the electronic device 102 may use two offset deviation thresholds 124, and increase 308 the gain 120 if the deviation is below one threshold and decrease the gain if the deviation is above another threshold. In another example, the electronic device 102 may compare the absolute offset 122 deviation with one threshold to determine the need of gain 120 change, and use the positive or negative direction of the deviation to determine if the gain should be decremented or incremented.

The electronic device 102 may determine 310 whether the reception of the input carrier signal 110 has ended. If the input carrier signal 110 has not ended, then the electronic device 102 may continue to update the gain 120 and the offset 122. The electronic device 102 may adjust the offset 122 to keep the unmodulated level steady. Furthermore, the electronic device 102 may increment/decrement the gain 120 index when the offset 122 deviation is excessive, and each gain 120 change may accompany a reactive or proactive offset 122 adjustment. By repeated offset 122 and gain-offset adjustment the electronic device 102 may support reception in a mobile setting. When the electronic device 102 determines 310 that the reception of the input carrier signal 110 has ended, the method 300 may be ended 312.

The method 300 may repeatedly adjust the offset 122, and if necessary, the gain 120 level, to keep the unmodulated level at the ADC 112 output at a preset target level 130. This method 300 may start on the completion of AGOC initial setting and continue until the receiver 104 (e.g., modem) exits the Rx mode. However, depending on performance criteria or the extent of mobility the electronic device 102 may end 312 the method 300 prematurely. For example, when receiving certain short packets, the effect of mobility could be too low to warrant spending resources on the electronic device 102 to counter it.

In one configuration, offset 122 control is the repeated adjustment of the offset 122 voltage to retain the unmodulated level at the ADC 112 output close to its target level 130. This may require adding the observed deviation of the unmodulated level from its target level 130 to the offset 122 value fed back to the RFA circuitry 109 as a control signal 137. This deviation may be a result of varying channel gain 120, which means even delta (Δ), the difference between unmodulated and modulated (mod) (i.e., low or high) levels, gets scaled up or down as the channel gain 120 varies. Because delta below a certain threshold may result in demodulation errors and delta above another threshold may increase the risk of signal saturation, indefinite offset 122 control may not be an adequate tracking solution. In other words, gain 120 control at certain points of time may be necessary to keep delta within an acceptable range.

For this purpose, a useful offset 122 range around the initial offset 122 value may be computed based on the desired minimum delta and maximum signal saturation. If the offset 122 goes beyond this range, the next higher or lower gain 120 level may be selected to cause the new offset 122 to fall within the useful range. Moreover, instead of reactively determining this new offset 122 after executing a gain 120 change, the offset 122 may be proactively computed and applied at the same time the gain 120 changes such that the signal levels do not get significantly shifted by the gain 120 change. This is the premise for simultaneous gain 120 and offset 122 control.

Unlike AGOC initial setting, AGOC tracking may happen when the rest of the modem (e.g., demodulator, acquisition engine, etc.) is functioning. Therefore, precautions for reducing the signal-level variation during offset 122 or a simultaneous gain 120 and offset 122 change may be critical where other digital blocks of the receiver 104 are not robust against signal-level disruptions that the gain 120 and offset 122 changes may cause. Tracking method 300 may include one or more additional features to achieve this aim.

One such additional feature is a maximum absolute limit imposed on offset 122 adjustment. This constraint may damp the AGOC 106 response and prevent AGOC 106 from inducing abrupt signal-level changes, which may affect the demodulator performance in certain receivers 104.

Another such feature of an AGOC 106 may be a constraint on minimum absolute offset 122 adjustment. Here, the motive may be to avoid unnecessary offset 122 updates by performing infrequent large offset 122 changes instead of small frequent offset 122 changes. This may help reduce resource used by AGOC especially when mobility is low.

Simultaneous gain 120 and offset 122 changes with proactive offset 120 calculation, could be yet another additional feature of an AGOC 106. This feature could potentially reduce the signal level shift caused during a gain 120 change and thereby prevent any performance loss that certain demodulators may incur due to gain 120 changes.

The AGOC 106 may also schedule gain 120 and offset 122 changes based on incoming signal and any prior information about its nature. For example, the AGOC 106 may predict 'safe-zones' for gain 120 changes by calculating when a disruption in signal due to a gain 120 change is the least likely to affect the demodulator performance. The knowledge of various packet types, data rates, etc. may be used for such prediction. Specific to NFC, the simplest example would be limiting gain 120 changes off the 'pauses' in the amplitude modulated carrier. Such precautions are beneficial where uncertainties in RFA circuitry 109 may make features like proactive offset calculation ineffective.

The main task of AGOC 106 is the generation of control signals 137 for the RFA circuitry 109 to appropriately scale and shift the input 132 to the ADC 112. In addition to those control signals 137, the AGOC 106 may generate signals for other digital blocks in the receiver 104. For example, such signals may indicate to a certain digital filtering block that the ADC 112 output may become unreliable for few clock cycles because of an imminent gain 120 change; that block may use this information to, for instance, reset the filter's internal state.

Figure 4:
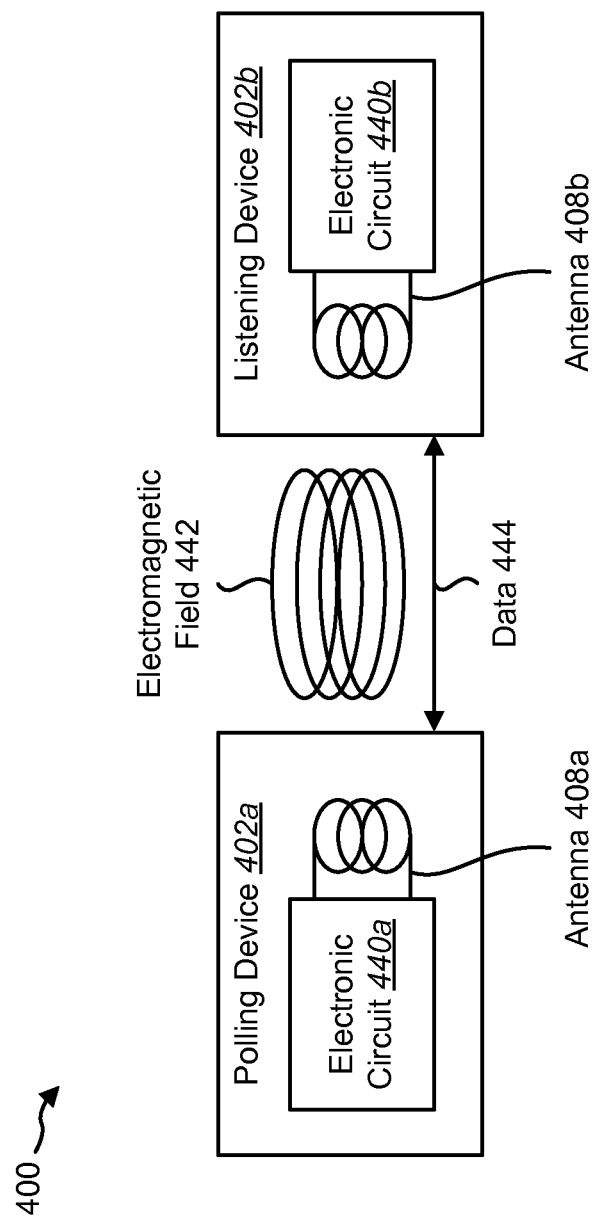
FIG. 4 is a block diagram illustrating one configuration of inductive communication in a wireless communication system.

FIG. 4 is a block diagram illustrating one configuration of inductive communication in a wireless communication system 400. A polling device 402*a* and a listening device 402*b* may operate according to NFC protocols. Each device 402*a-b* may include an antenna 408*a-b* connected to an electronic circuit 440*a-b*. During operation, the combination of two NFC devices 402 (i.e., the polling device 402*a* and listening device 402*b*) may behave like a 'transformer' to communicate a modulated carrier signal through inductive coupling.

NFC is an inductive communication technology. The two NFC-capable devices 402 may be separated by a distance. An alternating current (corresponding, for example, to a modulated carrier signal) may pass through a primary coil (i.e., the polling device antenna 408*a*) and create an electromagnetic field 442 (which may also be referred to as a radio frequency (RF) field or radiated field). The electromagnetic field 442 may induce a current in the secondary coil (i.e., the listening device antenna 408*b*). In addition to data transmission, the listening device 402*b* may also 'harvest' the electromagnetic energy transmitted by the polling device 402*a* to power itself.

The configuration and tuning of both antennas 408*a-b* may determine the coupling efficiency from one device 402 to the other device 402. The polling device 402*a* and the listening device 402*b* are shown in FIG. 4. During certain NFC transactions, the listening device 402*b* may function as a target, which is a role defined in the NFC standards. The present disclosure may relate to the receiver 104 of an NFC device 402 functioning as a target.

In one configuration, the NFC transmitter of one device 402 and the NFC receiver of the other wireless communication device 402 are configured according to a mutual resonant relationship. When the resonant frequency of the NFC receiver and the resonant frequency of the NFC transmitter are very close, transmission losses between the NFC transmitter and the NFC receiver located in the "near-field" of the radiated field are minimal.

An NFC device 402 may include an NFC loop antenna 408. The NFC loop antenna 408 may provide a means for energy transmission and reception. As stated, an efficient energy transfer may occur by coupling a large portion of the energy in the near-field of a transmitting antenna 408 to a receiving antenna 408 rather than propagating most of the energy in an electromagnetic wave to the far field. When in this near-field, a coupling mode may be developed between NFC loop antennas 408.

An NFC-capable device 402 may obtain sufficient data 444 to allow for communications to be established. One form of communications that may be established is an international standards organization data exchange protocol (ISO-DEP) communication link. Communications between the NFC devices may be enabled over a variety of NFC radio frequency (RF) technologies, including but not limited to, NFC-A, NFC-B, etc.

Figure 5:
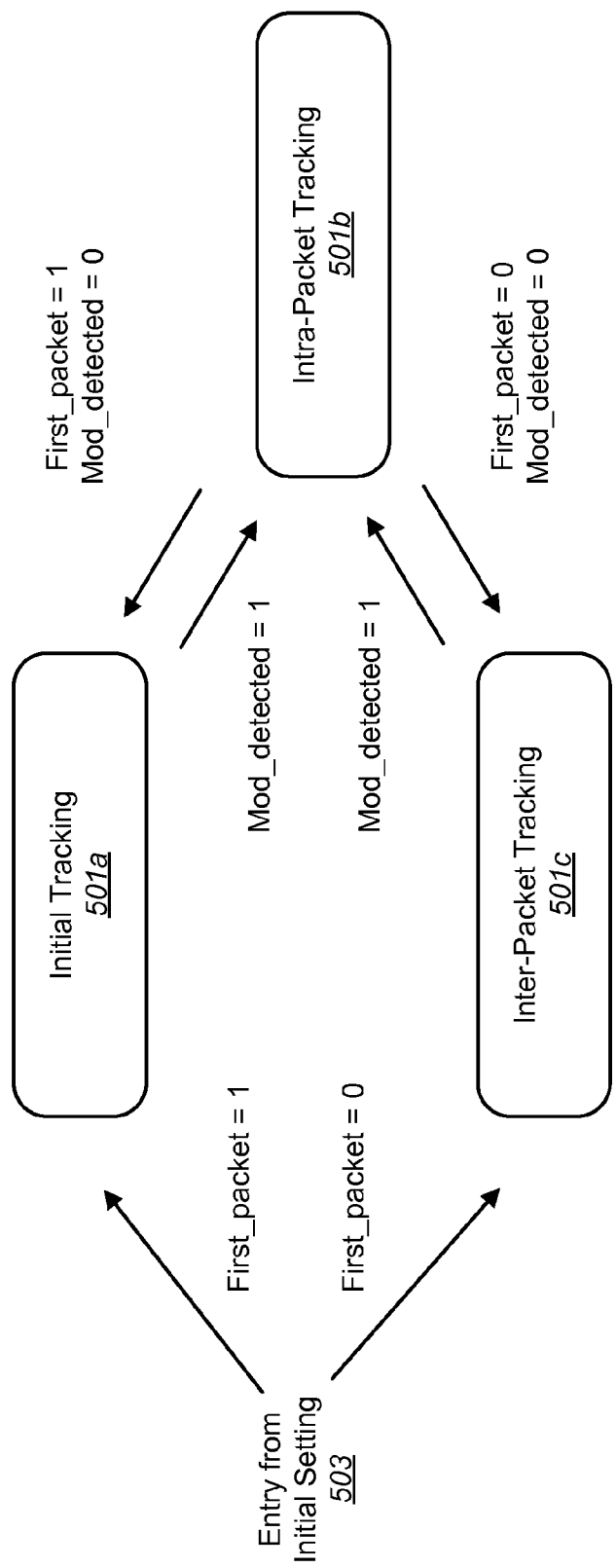
FIG. 5 illustrates state transitions among tracking modes.

FIG. 5 illustrates state transitions among tracking modes 501. Depending on the application, the extent of mobility support needed and other factors, AGOC 106 may restrict offset 122 changes or gain 120 and offset 122 changes for tracking to different segments of the incoming signals. For example, tracking may be restricted to the first packet if the wait-time for the first packet is longer than that for the subsequent packets; or, gain 120 changes during tracking may be suppressed within data packets (i.e., when the carrier is modulated) if the demodulator performance could get affected by transients due to gain 120 changes. Different tracking modes may be defined to facilitate such restrictions. FIG. 5 illustrates state transitions possible among three such tracking modes 501: 'initial tracking' 501a, 'inter-packet tracking' 501c and 'intra-packet tracking' 501b which may respectively correspond to (i) tracking while awaiting the first packet, (ii) tracking while awaiting all packets but the first packet, and (iii) tracking inside a packet while receiving modulated carrier.

Intra-packet tracking 501b may refer to AGOC 106 tracking within a data packet. In other words, the intra-packet tracking mode 501b may occur during a modulated carrier.

When the carrier is not modulated (i.e., unmodulated), tracking may be either in initial tracking mode 501a or inter-packet tracking mode 501c. These modes 501a,c may be functionally equivalent and may only distinguish whether the receiver 104 has or has not received the first packet in a communication. Even such distinction may increase the configurability of the AGOC 106. In another implementation, the modes could be functionally different, for example, to improve the reliability of the first packet's acquisition. In FIG. 5, 'First_packet=1' indicates that the receiver 104 awaits the first packet (i.e., first packet is yet to be received); and 'Mod_detected=1' indicates that the carrier is modulated.

Depending on the value of 'First_packet' indicator, the AGOC 106 may enter 503 initial tracking 501a or inter-packet tracking 501c from the initial setting. When the AGOC 106 detects a modulated input carrier signal 110, the AGOC 106 may set a Mod_detected indicator to 1, otherwise, the Mod_detected indicator is 0; based on Mod_detected indicator, the AGOC 106 may enter and exit intra-packet tracking mode 501b. A detailed example of AGOC 106 tracking is described in connection with FIG. 7.

Figure 6:
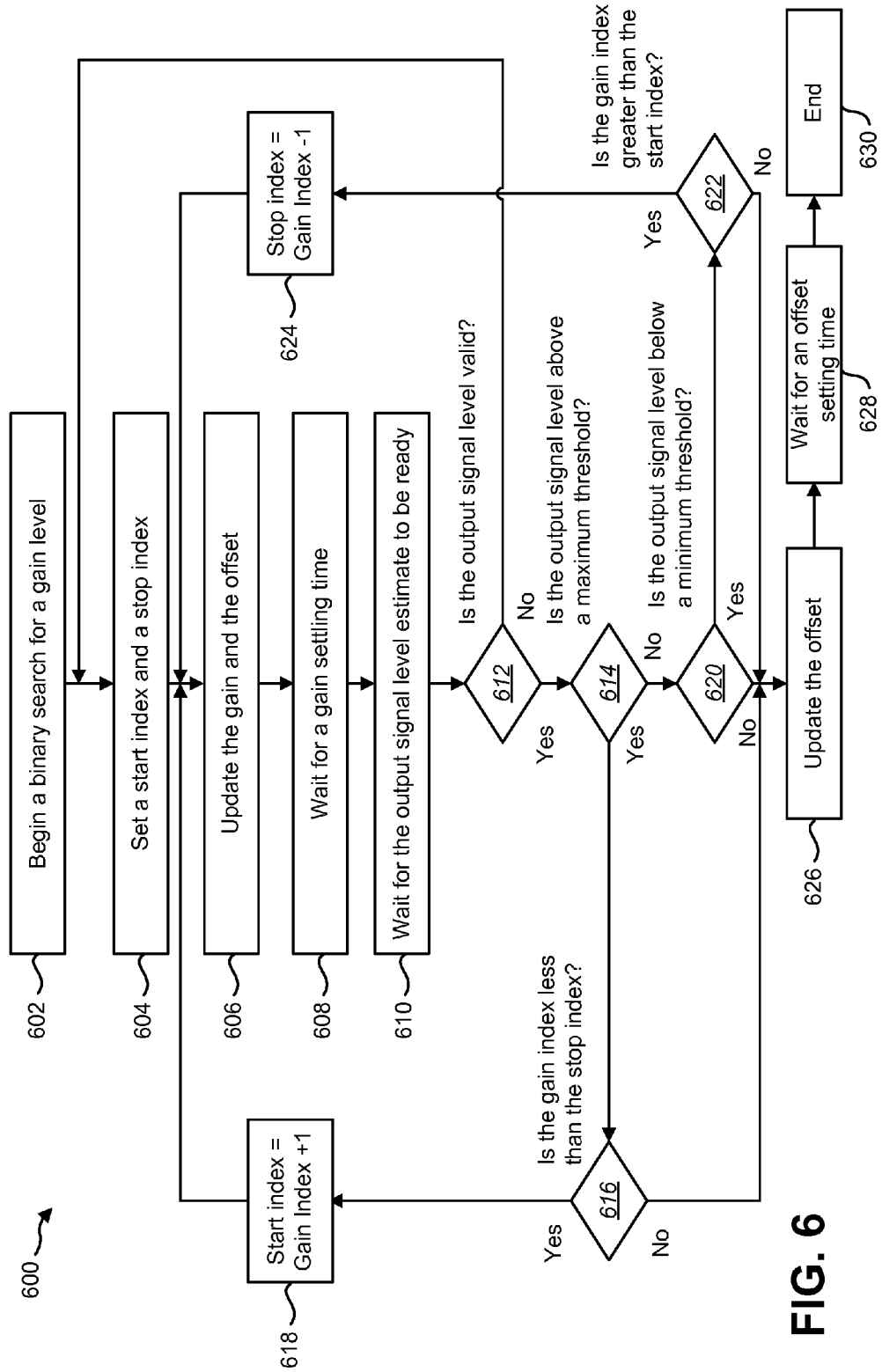
FIG. 6 is a flow diagram illustrating a method for AGOC initial setting.

FIG. 6 is a flow diagram illustrating a method 600 for AGOC initial setting. The method 600 may be implemented by an electronic device 102 that includes an AGOC 106.

The electronic device 102 may begin 602 a binary search over the available set of gain levels 126 to pick the gain 120 level suited for an input carrier signal 110, where the search happens over a logical "binary tree" structure whose nodes correspond to gain 120 levels. The electronic device 102 may use a start index and a stop index to keep track of the search sub-tree corresponding to a given iteration of the search algorithm, and those indices may be set 604 at the beginning of the algorithm to cover all the gain levels 126. The start index and stop index may be set to constrain the search to any subset of contiguous gain levels 126 between a minimum gain index and a maximum gain index.

The electronic device 102 may update 606 the gain 120 and the offset 122. For example, the electronic device 102 may set the gain 120 to be the mid gain 120 value in the subset of gain levels 126 constrained by start index and stop index, and the offset 122 may be set to a predetermined initial value. Then the electronic device 102 may wait 608 for a "gain settling" time (e.g., until transients in the RFA circuitry 109 due to the gain 120 and offset 122 change settle) before proceeding.

The electronic device 102 may estimate the DC value or the signal 134 level at the ADC 112 output. The electronic device 102 may wait 610 until the output signal 134 level estimation completes.

The electronic device 102 may determine 612 whether the estimated output signal 134 level is valid. For example, output signal 134 level may be deemed invalid if the output signal 134 unacceptably varies so as to make the estimate unreliable. If the output signal 134 level is not valid, then the electronic device 102 may restart 602 the AGOC initial setting.

If the output signal 134 level is valid, then the electronic device 102 may determine 614 whether the output signal 134 level is above a maximum threshold. If the output signal 134 level is above a maximum threshold, then the electronic device 102 may have to decrease the gain 120 level. For example, if the gain 120 decreases as the control signal 137 "gain index" increases for a set of gain levels 126, the electronic device 102 may set 618 the start index as the gain index plus one and update 606 the gain 120 and the offset 122 to pick the subset of gain levels 126 of lower gain 120 values. If the gain index is already at the stop index 616, the electronic device 102 may be already using the lowest gain 120 in the selected subset of gain levels and the binary search may be terminated without further gain 120 updates.

If the electronic device 102 determines 614 that the output signal 134 level is valid and not above a maximum threshold, the electronic device 102 may determine 620 whether the output signal 134 level is below a minimum threshold. If the output signal 134 level is below a minimum threshold, then the electronic device 102 may have to increase the gain 120 level. For example, if the gain 120 decreases as the control signal 137 "gain index" increases for a set of gain levels 126, the electronic device 102 may set 624 the stop index as the gain index minus one and update 606 the gain 120 and the offset 122 to pick the subset of gain levels 126 of higher gain 120 values. If the gain index is already at the start index 622, the electronic device 102 may be already using the highest gain 120 in the selected subset of gain levels and the binary search may be terminated without further gain 120 updates.

If the output signal 134 level is valid and not above a maximum threshold or below a minimum threshold, the electronic device 102 may be already using an appropriate gain 120 level for the output signal 134 level. In that case, binary search terminates without further gain 120 updates. At the termination of binary search, whether it is because the appropriate gain 120 was found or because it was not found even after exhausting all the gain levels 126, the electronic device 102 may proceed to next step-updating 626 the offset 122 to shift the unmodulated level at the ADC 112 output towards its target level 130. The electronic device 102 may adjust the offset 122 by the difference of the estimated output signal 134 and the target level 130 for the unmodulated signal.

The electronic device 102 may wait 628 for an "offset settling" time (i.e., until the transients in the RFA circuitry 109 due to the offset 122 change settle) and end 630 the AGOC initial setting.

Figure 7:
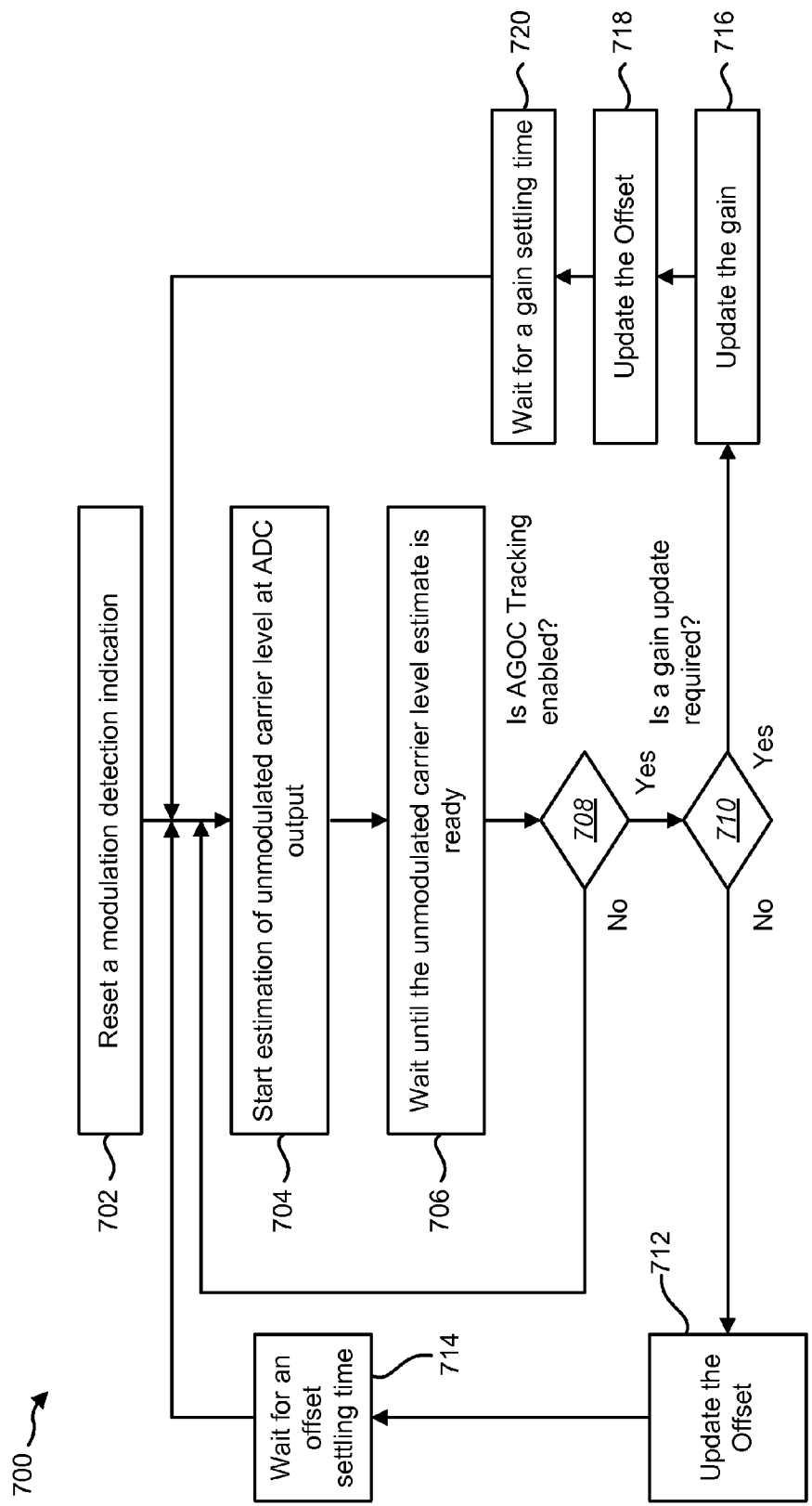
FIG. 7 is a flow diagram illustrating a method for AGOC tracking.

FIG. 7 is a flow diagram illustrating a method 700 for AGOC tracking. The method 700 may be implemented by an electronic device 102 that includes an AGOC 106. The method 700 may be performed upon completion of AGOC initial setting, as described above in connection with FIG. 6.

The electronic device 102 may reset 702 a modulation detection indication that controls transitions to/from intra-packet tracking mode 501b (i.e., Mod_detected indicator described in connection with FIG. 5). The electronic device 102 may continue to run a modulation detection mechanism parallel to AGOC tracking so that Mod_detected indicator may be respectively set to 1 or 0 as soon as a modulated carrier segment starts or ends.

The electronic device 102 may start 704 estimation of unmodulated carrier level at the ADC 112 output. For example, the electronic device 102 may reset any unmodulated carrier level (i.e., DC value) previously estimated using an output signal 134 from the ADC 112. Then the electronic device 102 may wait 706 until a new estimate of the unmodulated carrier level at the ADC 112 output 134 is ready. During intra-packet tracking 501b, the carrier is modulated, and an estimation mechanism that tracks the signal transition to and from modulated and unmodulated levels may be used to accurately estimate the unmodulated carrier level.

If AGOC tracking modes (e.g., 501a,b,c described in connection with FIG. 5) can be independently enabled or disabled, the electronic device 102 may determine 708 whether AGOC tracking is enabled (e.g., given the status of Mod_detected and First_packet indicators). If AGOC tracking is not enabled, the electronic device 102 may cycle through restarting estimation 704 (e.g., resetting) and re-estimating the 706 unmodulated carrier level at the ADC 112 output 134.

If the electronic device 102 determines 708 that AGOC tracking is enabled (e.g., given the status of Mod_detected and First_packet indicators), then the electronic device 102 may determine 710 whether a gain 120 update is required. In other words, the electronic device 102 may determine whether to perform an offset 122 update or a combined gain 120 and offset 122 update. When step 710="no", this corresponds to an offset 122 update. When step 710="yes", this corresponds to a simultaneous gain 120 and offset 122 update.

The electronic device 102 may start AGOC tracking method 700 with an unmodulated level already set close to its target level 130 at the ADC 112 output 134. For example, the initial gain 120 and initial offset 122 may be set as described in connection with FIG. 2. At any point during AGOC tracking, the absolute offset 122 deviation (e.g., deviation of the offset 122 from the initial offset used during initial setting) may indicate the appropriateness of the selected gain 120 for the input carrier signal 110 level at the antenna 108 output.

If a gain 120 update is not required, the electronic device 102 may update 712 the offset 122 by determining an offset 122 correction to maintain the unmodulated carrier level at the output 134 to the ADC 112 at the target level 130. The electronic device 102 may wait 714 for an offset 122 settling time before cycling through the AGOC tracking.

If the electronic device 102 determines 710 that a gain 120 update is required, it will determine the new gain index, which is the gain control signal 137 fed back to RFA circuitry 109. It may also proactively compute the new offset 122 to reduce the shifting of unmodulated level due to the gain 120 change.

The electronic device 102 may use the offset 122 to determine the new gain 120 level for the gain update 716. For example, the electronic device 102 may determine a deviation of an updated offset 122 from an initial offset 122. The electronic device 102 may decrease the gain 120 if the deviation is above an offset deviation threshold 124. The electronic device 102 may increase the gain 120 if the deviation is below another offset deviation threshold 124.

The electronic device 102 may then determine the offset 122 based on the updated gain 120. The electronic device 102 may determine an offset 122 to apply along with the gain update 716. The electronic device 102 may either update the offset 718 to a predetermined offset 122 value and reactively correct the offset 122 afterwards in order to bring the unmodulated level at the ADC 112 output to the target level 130, or the electronic device may 102 proactively calculate an offset 122 that would make the unmodulated level at the ADC 112 output as close to the target level 130 as possible when the offset update 718 is made along with the gain update 716. In either case, after a gain update 716 and offset update 718, the electronic device 102 may wait 720 for a "gain settling" time before cycling through the AGOC tracking.

The electronic device 102 may continue tracking indefinitely by cycling through offset updates 712, simultaneous gain and offset updates 716/718, or retries where AGOC tracking is disabled 708. The electronic device 102 may also enable/disable offset updates 712 and/or simultaneous gain/offset updates 716/718 depending on various tracking modes (e.g., disabling gain updates 716 during 'pauses' in intra-packet tracking mode 501b).

Figure 8:
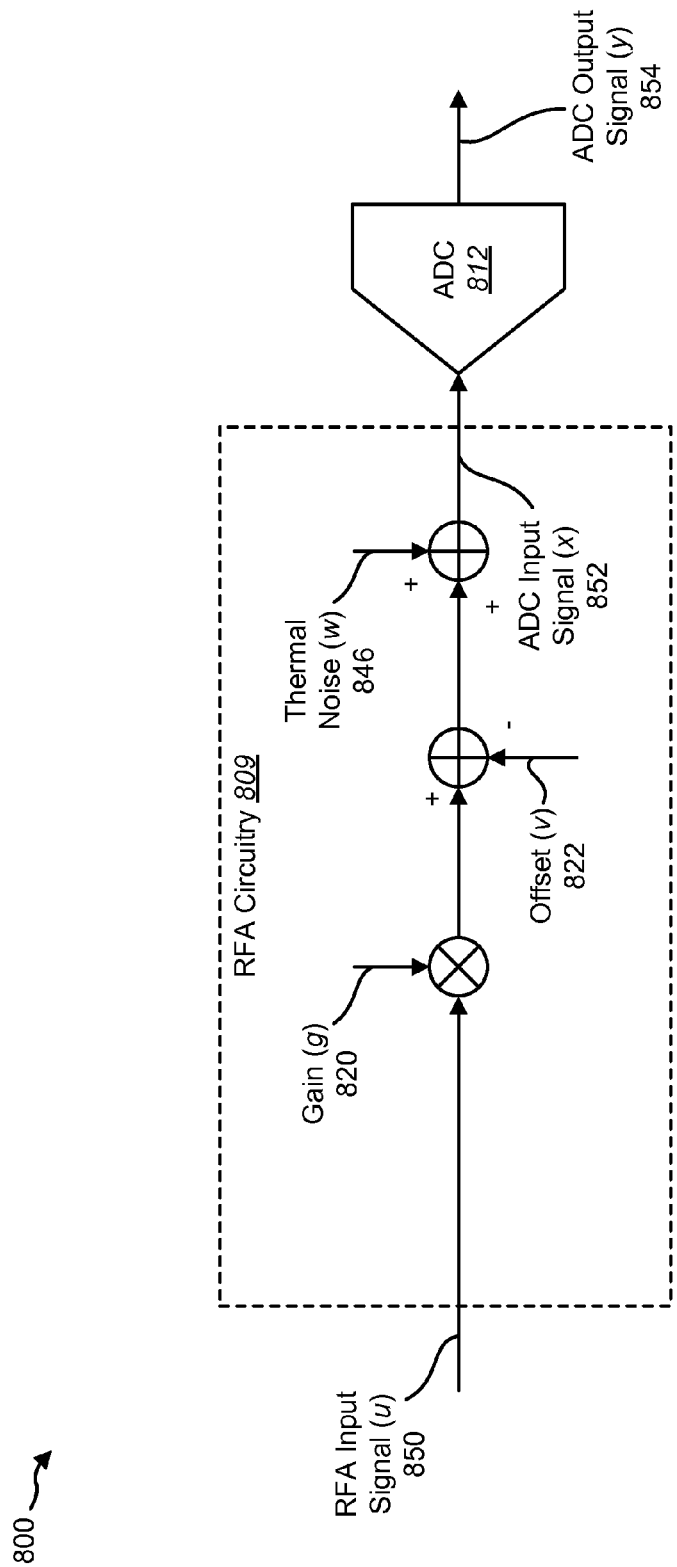
FIG. 8 is a diagram illustrating a simplified radio-frequency analog (RFA) circuitry model for an AGOC design.

FIG. 8 is a diagram illustrating a simplified model 800 of the RFA circuitry 109 described in connection with FIG. 1. The simplified RFA circuitry model 800 may assume a linearized mathematical model, where the 'effective gain' due to all attenuator and gain stages in the RFA circuitry 809 is represented as a multiplication factor 820 and offset is represented as an addition 822 in order to simplify the AGOC 106 design and analysis. The simplified RFA circuitry model 800 may also include an ADC 812. This model 800 may provide a sufficient level of abstraction to develop efficient algorithms for initial setting and tracking. The algorithms may be developed using the abstract gain 820 and offset 822 values in this mathematical model 800 and the AGOC 106 implementation may map those values to actual gain 120 and offset 122 control signals 137 fed back to the RFA circuitry 109.

A mathematical analysis of the AGOC 106 design may be based on the following equation: x=gu−v. This equation assumes the absence of thermal noise 846 and ADC 812 quantization errors. Here, x is the ADC input signal 852; g is the effective gain 820 (which is a combination of all gains 820 and attenuation the RFA circuitry 809 chain introduces); u is the RFA input signal 850; and v is a positive offset 822 voltage. For simplicity, it may be assumed that RFA input signal 850 is the envelope of the modulated or unmodulated input carrier signal 110 described in connection with FIG. 1. The ADC 812 will produce an ADC output signal 854 based on the ADC input signal 852. An example of an input-output relationship for the simplified RFA model 800 is described in connection with FIG. 9.

To simplify the analysis, suppose that the input carrier signal 110 has an ideal waveform of only modulated and unmodulated levels; i.e., RFA input signal 850 may take only one of the two possible values u ∈ {a,b} at a given time, where a is the unmodulated level and b is the modulated level. Then a modulation index m may be defined as $$m = \frac{a-b}{a+b}. \tag{1}$$

By using Equation (1), the difference between the unmodulated and modulated levels may be defined as $$a - b = \mu a \tag{2}$$

where $\mu$ is defined to be $$\mu = \frac{2m}{1+m}. \tag{3}$$

The modulation depth ($\Delta$) at the ADC output 854 is the difference between unmodulated and modulated levels after being scaled by gain g, and it may be defined as $\Delta = ga - gb$. From Equation (2), $\Delta = \mu g a$. In order to successfully demodulate the ADC output 854, it may have to be ensured that $\Delta$ is greater than a demodulation sensitivity level.

Assuming that the minimum modulation index is $m_{min}$, which may be 7% among all NFC technology types, the $\Delta$ may always be expected to be greater than a minimum value $$\Delta_{min} = \mu_{min} g a \tag{4}$$

where $$\mu_{min} = \frac{2m_{min}}{1+m_{min}}. \tag{5}$$

The parameter $\mu_{min}$ may be used as a design parameter. To guarantee that $\Delta = \mu g a \geq \Delta_{min}$ irrespective of the actual $\mu$ value that corresponds to any modulation index m, the following inequality may be ensured:

$$g a \geq \frac{\Delta_{min}}{\mu_{min}}. \tag{6}$$

Since the AGOC 106 is meant to determine the initial gain 120 and offset 122 before a packet starts, only the unmodulated carrier level (i.e., u=a) may be available at the input 850. Therefore, to meet the $\Delta_{min}$ requirement a gain 820 may be determined to meet the following inequality for any given RFA input 850 level u:

$$g u \geq \frac{\Delta_{min}}{\mu_{min}}. \tag{7}$$

Suppose an RFA input voltage 850 range $[u_0, u_1]$ is to fall onto the dynamic range of the ADC 812 after being scaled by a gain 820 $g_1$ and shifted by an offset 822 $v_0$. Since $u_0$ is the lowest value for this range, if the above inequality is satisfied for $u_0$, it would automatically be satisfied for all other values in the range $[u_0, u_1]$. Therefore, according to Equation (1), this may require that $$-0.5 = g_1 u_0 - v_0 \tag{8}$$

and $$0.5 = g_1 u_1 - v_0 \tag{9}$$

given an offset 822 $v_0$. These equations illustrate only the case where the ADC input 852 range is $[-0.5, 0.5]$.

A set of gain levels 126 to be used by the AGOC 106 may be designed by successively computing a series of gain 820 values $g_1, g_2, \ldots g_N$. Only the first equality, Equation (8), needs to be considered to compute $g_1$ when a certain $u_0$ is given. Then, the value of $u_1$ computed with Equation (9) by substituting thus computed $g_1$ may be used to compute $g_2$, which is the next gain 820 level. In this manner, successive application of Equations (8) and (9) may provide a series of N gain 820 values $g_1, g_2, \ldots g_N$ mapping a range $[u_0, u_N]$ onto the ADC 812 dynamic range. The only unknown is the value of offset 822 voltage $v_0$, which may be fixed a constant for all gain 820 levels or varied from gain level to gain level. For illustration purposes, let $v_0$ be fixed. In relation to the binary search described in connection with FIG. 1, this offset may be regarded as the 'initial offset'.

Based on the $\Delta_{min}$ condition, the following lower bound for initial offset $v_0$ may be defined:

$$v_0 \geq v_{min} \tag{10}$$

where $$v_{min} = 0.5 + \frac{\Delta_{min}}{\mu_{min}}. \tag{11}$$

In other words, the $\Delta_{min}$ condition for the range of RFA input voltages $[u_{n-1}, u_n]$ is met if $v_0 \geq v_{min}$. Then, for simplicity, $v_0$ may be set as $v_0 = v_{min}$, and for a given $u_0$, the corresponding gain $g_1$ may be calculated as $$g_1 = \frac{v_0 - 0.5}{u_0} = \frac{v_{min} - 0.5}{u_0}. \tag{12}$$

Successive application of Equations (8) and (9) gives other gain 820 levels $g_2, g_3, \ldots g_N$ as follows:

$$g_k = \frac{v_{min} - 0.5}{v_{min} + 0.5} \cdot g_{k-1} \tag{13}$$

The gain 820 levels $g_1, g_2, \ldots g_N$ designed by fixing $v_{min}$ as described above forms a geometric series of numbers (i.e., logarithmically spaced). If certain $\Delta_{min}$ is selected and $v_0$ offset 822 is chosen as $v_0 = v_{min}$ and to meet Equation (11), the designed gain 820 levels and the offset 822 would guarantee that the modulation depth $\Delta$ at the ADC 812 output will always meet the $\Delta_{min}$ condition.

Figure 9:
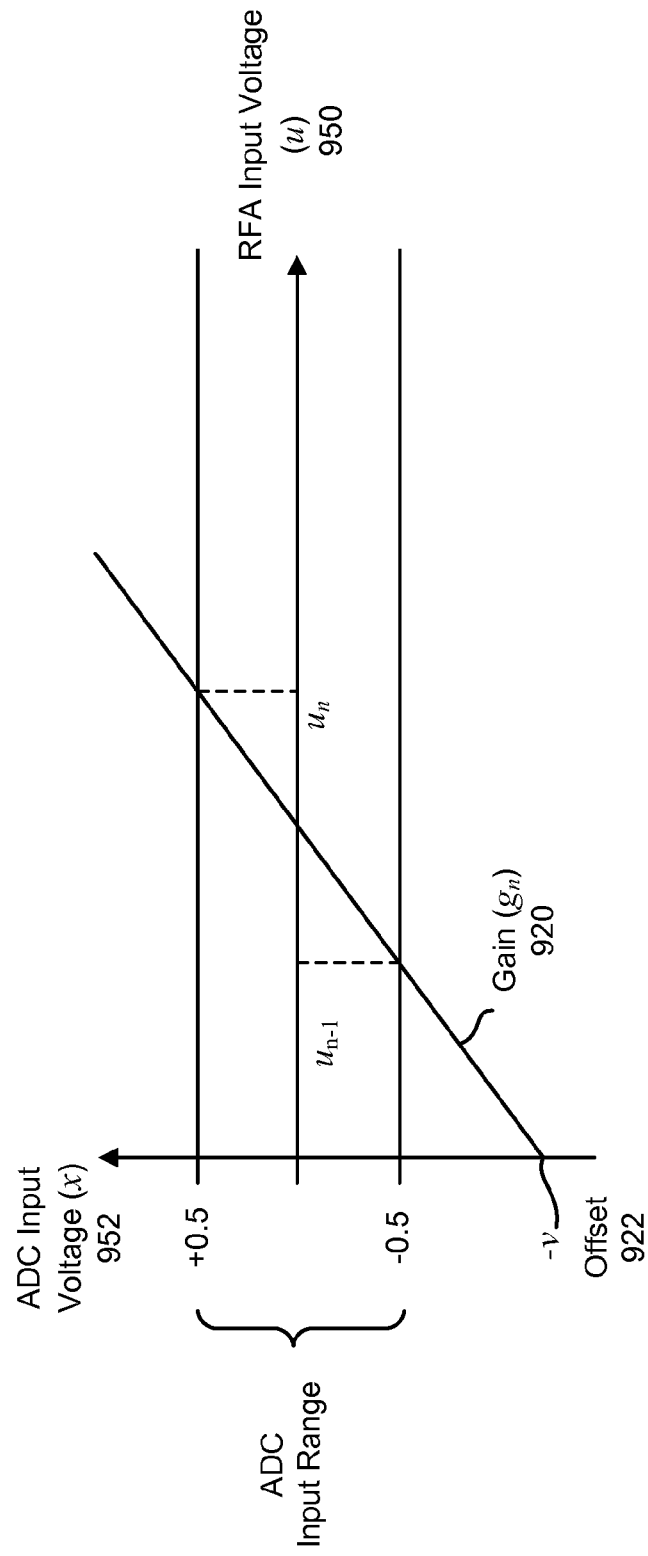
FIG. 9 is a graph that geometrically illustrates the input-output relationship for the simplified RFA model.

FIG. 9 is a graph that geometrically illustrates the input-output relationship for the simplified RFA model 800. The ADC input voltage 952 is plotted for a range of RFA input voltages 950 with a given gain 920 and offset 922. FIG. 9 shows that the selected gain 920 $g_n$ and offset 922 v may linearly map an RFA input voltage 950 range $u \in [u_{n-1}, u_n]$ onto the ADC input voltage 952 range, e.g., $[-0.5, 0.5]$. Any RFA input voltages 950 falling outside the range $u \in [u_{n-1}, u_n]$ would either over-saturate or under-saturate the ADC 812.

This range $[u_{n-1}, u_n]$ of RFA input voltages 950 may be shifted and widened/narrowed by changing the gain 920 or the offset 922. In other words, each $(g_n, v)$ pair corresponds to a distinct input range $[u_{n-1}, u_n]$. Thus, the initial offset 922 v may be chosen to shift the mapping of RFA input voltage 950 range (e.g., $[u_{n-1}, u_n]$) to an ADC input voltage 952 range corresponding to a given gain 920 $g_n$. In other words, the choice of initial offset 922 v dictates $\Delta_{min}$ ensured by a particular gain design.

The binary-search phase of AGOC 106 initial setting may use the initial offset 922, and depending on its value, a gain 920 would be selected to bring the ADC input 951 (and hence, the ADC output 854) fall within the ADC 812 dynamic range. Actual ADC output 854 at the end of binary search could be anywhere in the ADC 812 dynamic range. At the completion of binary search, the offset 922 may be corrected to bring the ADC output 854 to its final value (corresponding to target level 130 described in connection with FIG. 1). This corrected offset 922 may be referred to as the "final offset". The final offset 922 depends on the selected gain 920 level, RFA input voltage 950, and the target level 130 for the unmodulated level at the ADC output 854. When the RFA input voltage 950 changes (e.g., due to mobility), the ADC output 854 should change if the final offset 922 remains unchanged. In AGOC 106 tracking, the final offset 922 may be constantly adjusted to compensate for variation of the RFA input voltage (or, equivalently, the input carrier signal 110 strength). As this updated offset 922 deviates from the initial offset, the unmodulated level at the ADC 812 would head towards either over-saturation or under-saturation. Therefore, the deviation of that updated offset 922 from the initial offset 922 may be used as an indication of when to switch the gain 920 level.

Figure 10:
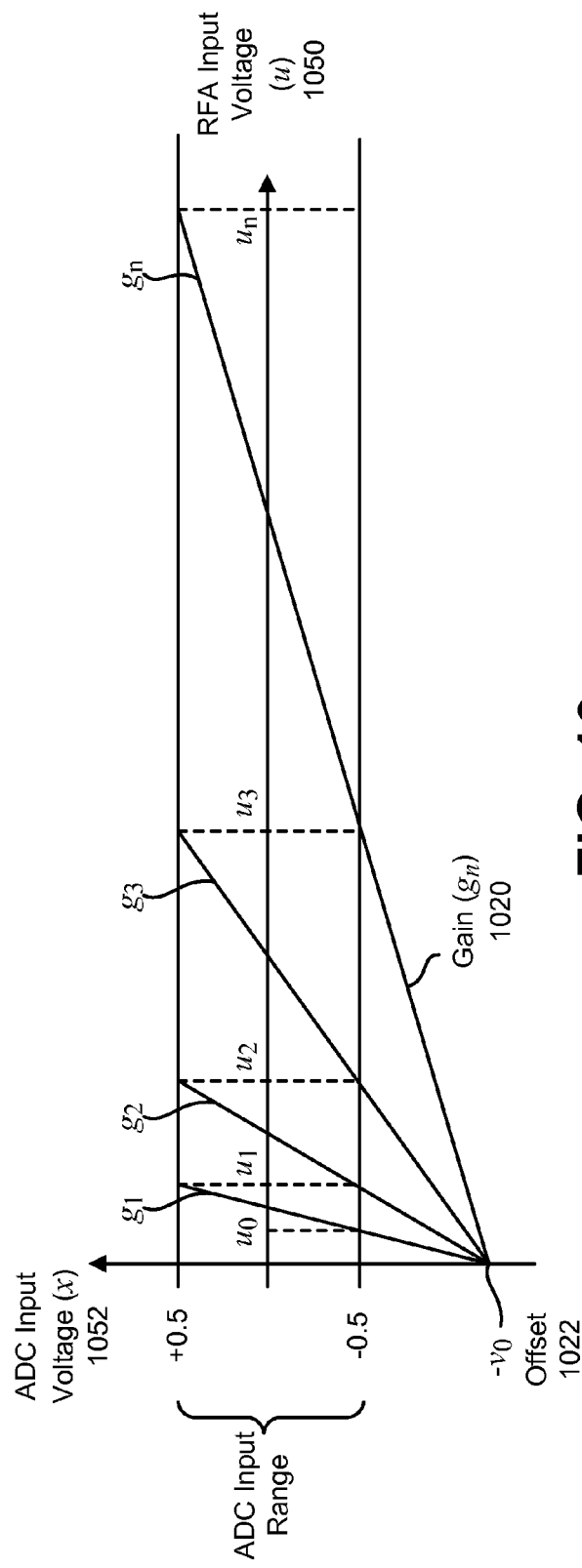
FIG. 10 is a graph illustrating a gain-level design that partitions the input range to ensure AGOC coverage.

FIG. 10 is a graph illustrating a gain 1020 level design $g_1$, $g_2$, ... $g_n$ that partitions the RFA input voltage 1050 range $[u_0, u_n]$ to ensure AGOC 106 initial setting convergence for any RFA input $u \in [u_0, u_n]$. Specifically, FIG. 10 describes a gain-design problem.

The ADC input voltage 1052 is plotted for a range of RFA input voltages 1050 with given gains 1020 and assuming a fixed offset 1022 $v_0$. FIG. 10 shows how each gain $g_n$ 1020 may linearly map a distinct RFA input voltage 1050 range $u \in [u_{n-1}, u_n]$ onto the ADC input voltage 1052 range, which is assumed to be $[-0.5, 0.5]$ for illustration.

Because the ADC 812 input may only span a 1V range (in the illustrated configuration), a gain $g_n$ may map only a $1/g_n$ range of the input signal onto the ADC 812 input. In general, a gain $g_n$ may map only an input signal range proportional to $1/g_n$ onto the ADC 812 input. Therefore, a set of logarithmically-spaced gains 1020 determined as illustrated above may logarithmically partition the dynamic range of the RFA input voltage 1050 range.

The logarithmic relationship observed among successive gain 1020 levels as well as the input range 1050 corresponding to each gain 1020 level can be summarized as follows. Suppose a set $\{g_1, g_2, \ldots, g_N\}$ of N gain 1020 levels may be found such that, along with a fixed initial offset $v_0$, each gain $g_n$ maps a partition $[u_{n-1}, u_n]$ of the input signal (i.e., the RFA input voltage 1050) onto the ADC 812 input (i.e., the ADC input voltage 1052). Successive gain 1020 levels may be selected so that the partitions align at $u \in \{u_0, u_1, u_2 \ldots, u_N\}$ to seamlessly cover the whole dynamic range of the RFA input voltage 1050.

A parameter r may be defined as $$r = \frac{v_0 - 0.5}{v_0 + 0.5}. \tag{14}$$

Assuming that the minimum RFA input signal 1050 to be covered is $u_0$, elementary geometry may be used to calculate $u_n$:

$$\frac{u_n}{u_0} = r^{-n} \tag{15}$$

for n=1, ..., N. Also, $g_n$ may be calculated such that $$\frac{g_n}{g_1} = r^{n-1} \tag{16}$$

and $$g_1 = \frac{v_0 - 0.5}{u_0}. \tag{17}$$

The number of gain 1020 levels (i.e., the number of partitions) is $$N = \left\lceil \frac{\log\left(\frac{u_{max}}{u_0}\right)}{\log\frac{1}{r}} \right\rceil \tag{18}$$

where $u_{max}$ is the maximum input signal level to be covered. Finally, it may be shown that $$(v_0 - 0.5)\mu \leq \Delta \leq (v_0 + 0.5)\mu. \tag{19}$$

Figure 11:
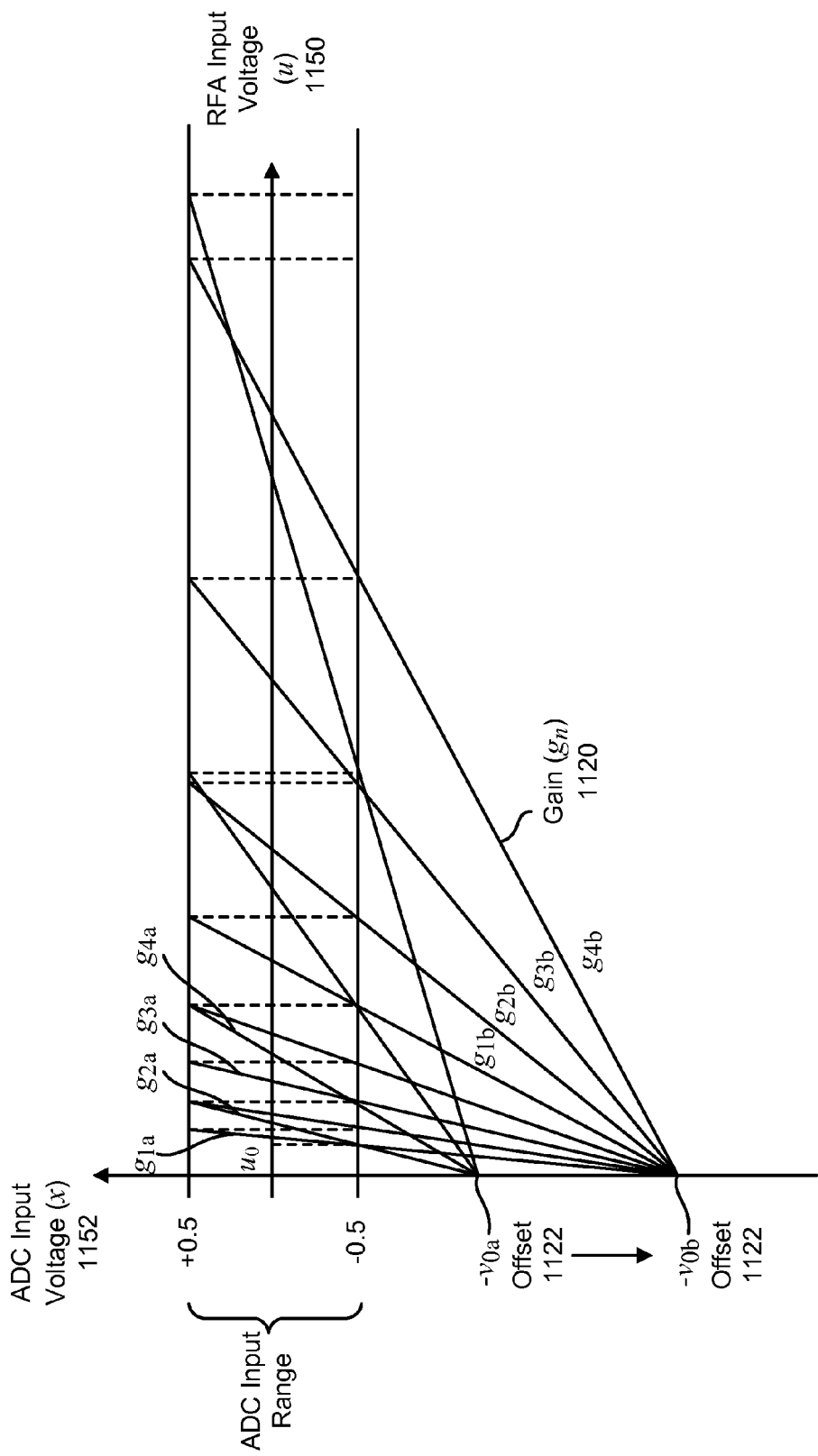
FIG. 11 is a graph illustrating the effect of changing the initial offset $v_0$ on the number of partitions required to ensure AGOC coverage.

FIG. 11 is a graph illustrating the effect of changing the initial offset 1122 $v_0$ on the number of partitions required for the AGOC 106 coverage. The ADC input voltage 1152 is plotted for a range of RFA input voltages 1150 for two offset 1122 values $v_{0a}$ and $v_{0b}$ and for the corresponding two sets of gains 1120 $\{g_{1a}, g_{2a}, \ldots\}$ and $\{g_{1b}, g_{2b}, \ldots\}$ that are determined by using Equations (16) and (17) to partition the same RFA input voltage 1150 range. As evident from the gains 1120 corresponding to initial offset 1122 $v_{0b}$ having steeper slopes (on FIG. 11) than those corresponding to initial offset 1122 $v_{0a}$, the gain 1120 corresponding to a given RFA input voltage 1150 increases with increasing initial offset 1122. Consequently, $\Delta_{min}$ also increases as the initial offset 1122 is increased. This fact may also be inferred from Equation (11). This may be a favorable result. However, as shown in FIG. 11, the number of gain 1120 levels (i.e., the number of partitions) required to cover a given RFA input voltage 1150 range may also increase. This effect is because larger gains $g_n$ required to achieve higher $\Delta_{min}$ with a given RFA input voltage 1150 would result in narrower partitions (recall: proportionality to $1/g_n$). Moreover, as Equation (19) suggests, increased $\Delta$ may make it more likely for the input signal to saturate the ADC 812.

Figure 12:
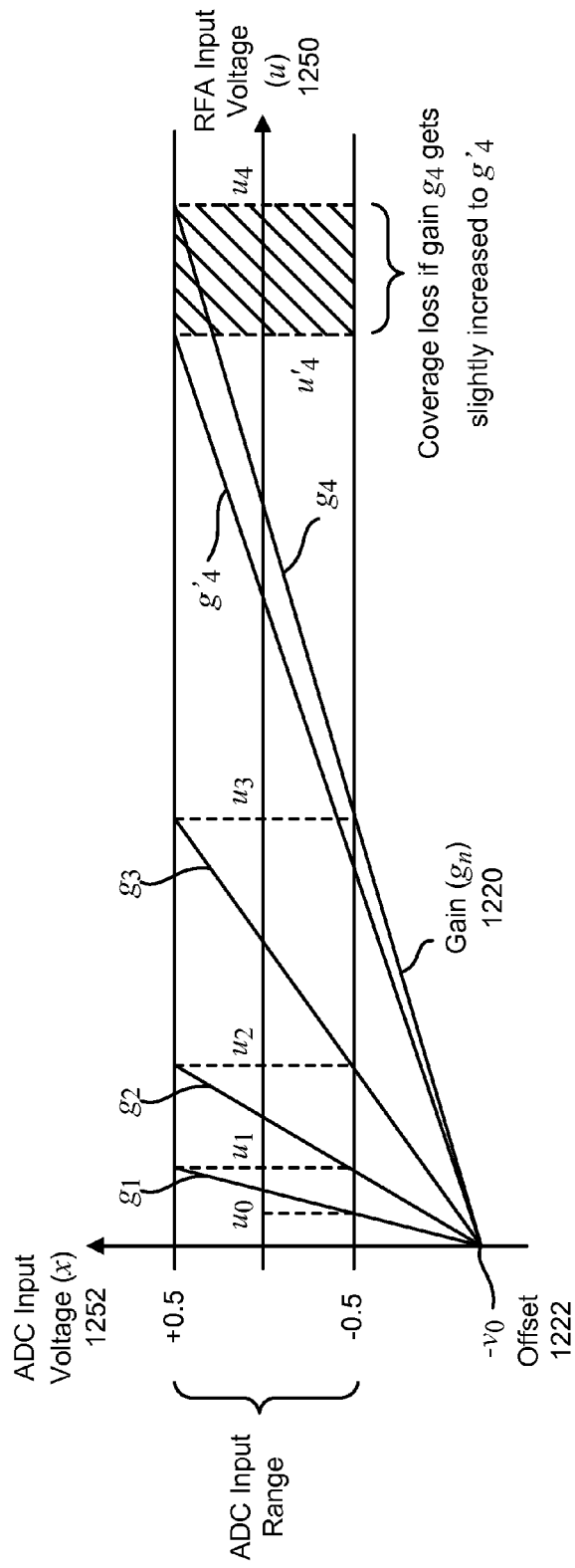
FIG. 12 is a graph illustrating the effect of gain variation on the AGOC coverage.

FIG. 12 is a graph illustrating the effect of gain 1220 variation on the AGOC 106 coverage. Specifically, FIG. 12 illustrates why gain 1220 tolerance is a significant concern during gain design for the AGOC 106 coverage.

The description of the gain-design problem in connection with FIGS. 9, 10, and 11 assumes ideal gain 820 realizations in RFA circuitry 809. However, in reality the actual gain 820 values may deviate from their nominal values due to various reasons (e.g., process, temperature, or supply voltage variation). Such variation may break the seamless coverage achieved (as in connection with FIG. 10) by partitioning the RFA input voltage 1250 range into a set of non-overlapping sub-ranges catered to by a set of gains 1220 $\{g_1, g_2, \ldots, g_N\}$. The ADC input voltage 1252 is plotted for a range of RFA input voltages 1250 for a set of gains 1220 and an offset 1222 determined as before. FIG. 12 also highlights the coverage loss corresponding to a small gain 1220 deviation of gain $g_4$ to a value $g'_4$; clearly, a small gain variation may leave a portion of the input range (i.e., shaded area in FIG.

12) uncovered. This illustration suggests that a set of overlapping gains 1220 may be needed to ensure AGOC 106 coverage.

Figure 13:
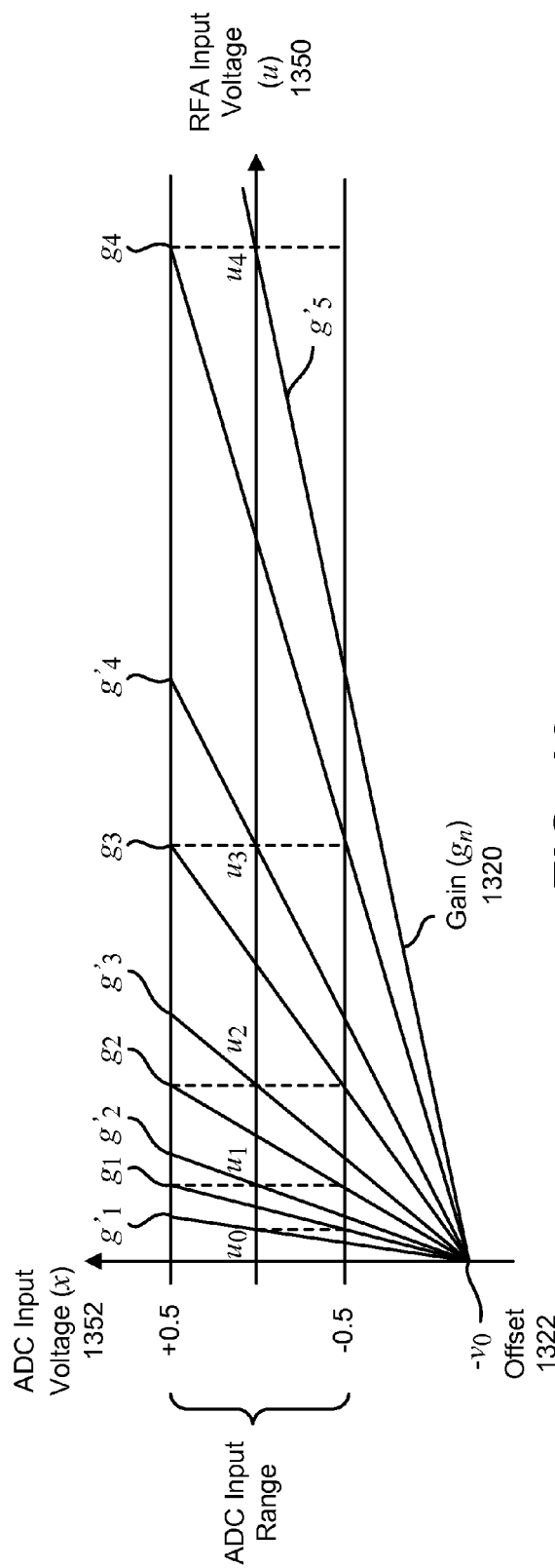
FIG. 13 is a graph illustrating gain-level design with overlapping partitions that allows for more gain tolerance on the AGOC coverage.

FIG. 13 is a graph illustrating an AGOC 106 gain design with overlapping gain 1320 levels to introduce tolerance to gain 1320 variation. The ADC input voltage 1352 is plotted for a range of RFA input voltages 1350 with given gains 1320 and an offset 1322. In this "simplest" gain design with overlaps, gain 1320 levels $\{g'_1, g'_2, \ldots\}$ are added between each successive pair of gains 1320 $\{g_1, g_2, \ldots\}$ designed in the same manner as with FIG. 10. In a more sophisticated gain design, calculated amounts of overlap may be introduced between adjacent partitions depending on the extent of gain 1320 tolerance required. Either way, with an overlapping gain 1320 design, each input level u may be covered when the gains 1320 deviate (up to a certain extent) from their nominal values.

The analysis made in connection with FIG. 10 may be extended to FIG. 13 to include gain 1320 variation as follows. Suppose β is the maximum fractional error in a gain 1320 level. The value of r in Equations (15) and (16) to cover the RFA input voltage 1350 range [u0,$u_{max}$] by using N "partitions" (more accurately, N overlapping sub-ranges) while tolerating a fractional gain 1320 variation of β may be given by $$r = \left( \frac{u_0 \cdot (1-\beta)}{u_{max} \cdot (1+\beta)} \right)^{1/N}. \quad (20)$$

To ensure sufficient overlap between adjacent partitions, this r should also meet $$1 > r \geq \left( \frac{v_0 - 0.5}{v_0 + 0.5} \right) \cdot \left( \frac{1+\beta}{1-\beta} \right). \quad (21)$$

As with other illustrations, the ADC input voltage 1352 range is assumed to be [−0.5,0.5]; the analysis needs only slight modification to accommodate a different input range.

Now that it is known how many gain levels are needed and what their value should be, the gain 1320 level and the final offset 1322 voltage for a given input signal level 1350 may be calculated, as described above in connection with AGOC initial setting. Furthermore, the input signal level 1350 may be tracked as the target moves within the operating volume and the gain 1320 level and the offset 1322 voltage may be updated to compensate for the effect of mobility, as described above in connection with AGOC tracking.

AGOC initial setting may take place (at most) once every packet. The aim of AGOC initial setting is to compute the gain 1320 and offset 1322 without relying on prior knowledge of initial gain 1320 or offset 1322 required even to measure the input carrier signal level 110. The input carrier signal 110 may be assumed to be unmodulated during AGOC initial setting. Therefore, the ADC output 854 may simply be averaged (possibly after further filtering to remove transients or remaining carrier and harmonics after envelope detection in the RFA circuitry 809) to estimate the DC value.

AGOC initial setting assumes that the gain 1320 levels may have been designed so that they cover (possibly, with overlaps) the dynamic range of the input range 1350 when applied along with a fixed initial offset 1322.

AGOC initial setting may search over the available gain 1320 levels, while evaluating the suitability of each selected gain 1320 level based on the following three premises. First, the selected gain 1320 is acceptable if the input signal falls within the ADC 812 input range; the search may be concluded. Second, the gain 1320 is too high if the input signal causes the ADC 812 to over-saturate; a lower gain 1320 should be applied and the search should be repeated. Third, the gain 1320 is too low if the input signal causes the ADC 812 to under-saturate; a higher gain 1320 should be applied and the search should be repeated.

In other words, AGOC initial setting is a search over a set of pre-designed gain 1320 levels conducted based on two conditions: ADC 812 over-saturation and ADC 812 under-saturation. If the gain 1320 levels are designed to be in the descending order of their values, AGOC initial setting corresponds to a binary search tree (see FIG. 14 for an illustration of a search over 15 gain 1320 levels), and the search may converge with logarithmic complexity in the number of search iterations. A binary-search eliminates approximately half of the gain 1320 levels in each search iteration, and thereby achieves the lowest worst-case search time for a set of gain 1320 levels.

AGOC tracking may modify the gain 1320 and offset 1322 to compensate for the effects of mobility. Since AGOC tracking continues even within packets (e.g., during intra-packet tracking mode 501*b*), a simple average of the ADC output 854 may not be suitable as an estimate of the unmodulated level. A signal-level aware filtering or averaging mechanism may be required to estimate the unmodulated level from the ADC output signal 134. This level may be estimated by the AGOC or possibly and more easily computed by another digital block involved with the demodulation of data. AGOC tracking may periodically monitor the unmodulated level at the ADC output 134 and determine its deviation from a preset target value 130. If that deviation is significant, the offset 1322 may be corrected by the same amount as that deviation so that the unmodulated level may get shifted to target value 130. With an initial offset v selected to meet Equation (19), the offset 1322 should remain within the range [−v−0.5,−v+0.5]. If the offset 1322 moves outside this range, adjacent lower/higher gain 1320 level should be selected to bring the offset 1322 back within its valid range. In general, the deviation of offset 1322 from the initial offset v may be compared against preset offset deviation thresholds 124 to assert the need for gain 1320 updates.

FIG. 14 is a diagram illustrating a "binary search tree" corresponding to 15 gain 1420 levels assuming that gain 1420 values $g_n$, n ∈ $\{1, \ldots, N\}$ decrease as the gain index n increases. The binary search always starts with the middle gain index (i.e., $g_8$ for 15 gain levels) and that level corresponds to the "root" of the search tree. If the ADC 1412 over-saturates, the search algorithm determines that the applied gain is too high and discards all higher gain 1420 values. In other words, the search algorithm would pick the "right sub-tree" of the current node (i.e., gain indices greater than the current gain index) and iterate the search. If the ADC 1412 under-saturates, the "left sub-tree" would be selected for the next search iteration. If the ADC 1412 neither over-saturates nor under-saturates, the search algorithm infers that the applied gain is appropriate for the input signal level and concludes the search.

By eliminating approximately half of the candidate gain 1420 levels at each iteration, a binary search converges with a logarithmic time complexity to determine the gain 1420 that suits the input signal level. Once the binary search completes, the unmodulated level of the scaled and shifted signal 132 may be within the ADC 112 input range. In other words, there may be a measurable value of the unmodulated level at the ADC 112 output. This value may be used to estimate the final offset 122. The offset 122 adjustment may be performed to bring the unmodulated level at the ADC output 134 to a preset target level 130.

If AGOC tracking is not enabled, the first offset 122 adjustment following the binary search may conclude the AGOC 106 operation. In that case, the selected gain 1420 and offset 122 setting may be used during an entire NFC transaction. Where tracking is enabled offset 122 is constantly adjusted to keep the unmodulated level at the ADC output 134 at the target level 130 and gain 120 updates are executed as necessary to keep the offset 122 within an acceptable range around the initial offset 122 used during the binary search.

Figure 15:
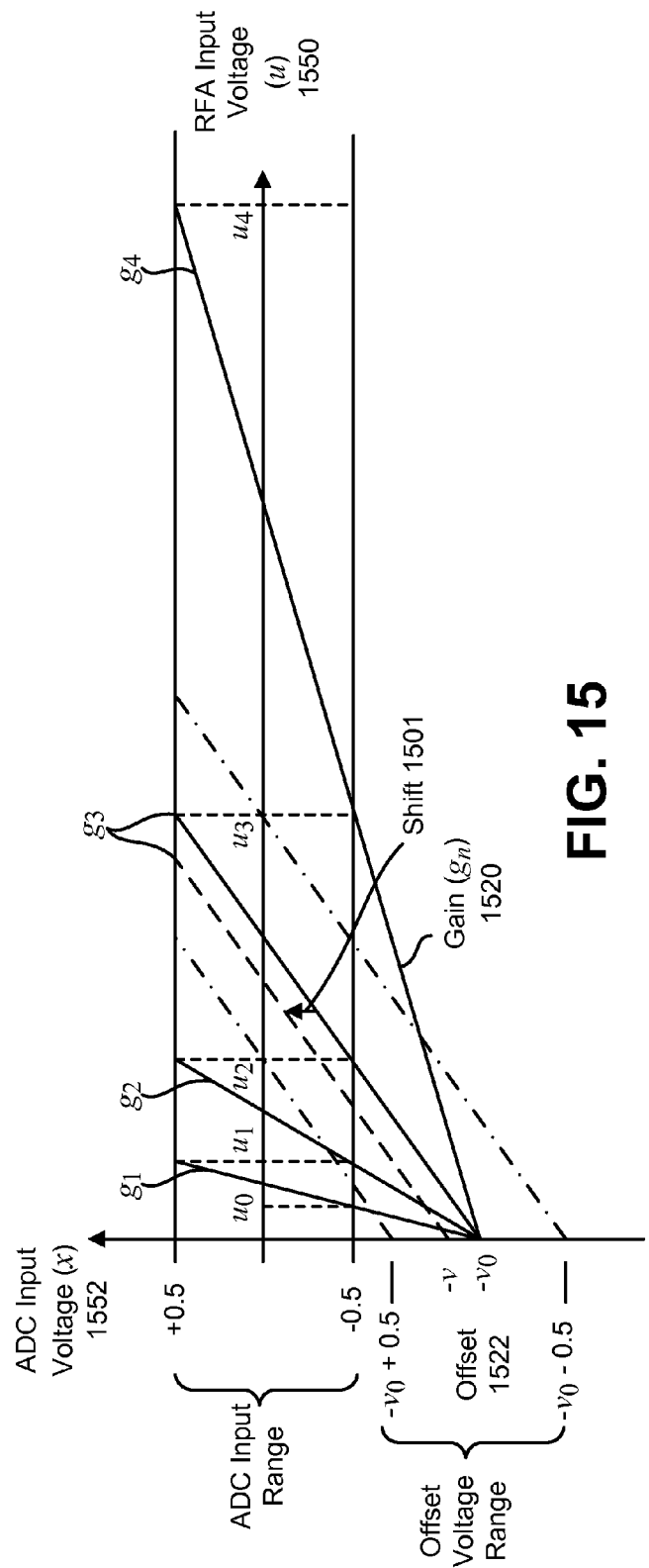
FIG. 15 is a graph illustrating an useful offset voltage range around the initial offset.

FIG. 15 is a graph illustrating an offset 1522 voltage range around an initial offset 1522 $v_0$. The ADC input voltage 1552 is plotted for a range of RFA input voltages 1550 with given gains 1520 and an offset 1522. The illustrated gain 1520 design assumes an ADC input range [−0.5, 0.5] and includes no overlaps for gain 1520 variation tolerance.

The solid black lines in FIG. 15 correspond to the equation $x = g_n \cdot u - v_0$ for each gain 1520 level $g_n$, where $v_0$ is the initial offset 1522. The shift arrow 1501 shows how the line for gain $g_3$ may shift for a different offset v 1522. The dashed-dotted lines define the valid region for the shifted offset 1522, which may take any value within ±0.5V from $v_0$. If the offset 1522 v shifts 1501 outside that range, either $g_2$ or $g_4$ should be chosen so that the new offset 1522 may fall back inside the valid range again.

Figure 16:
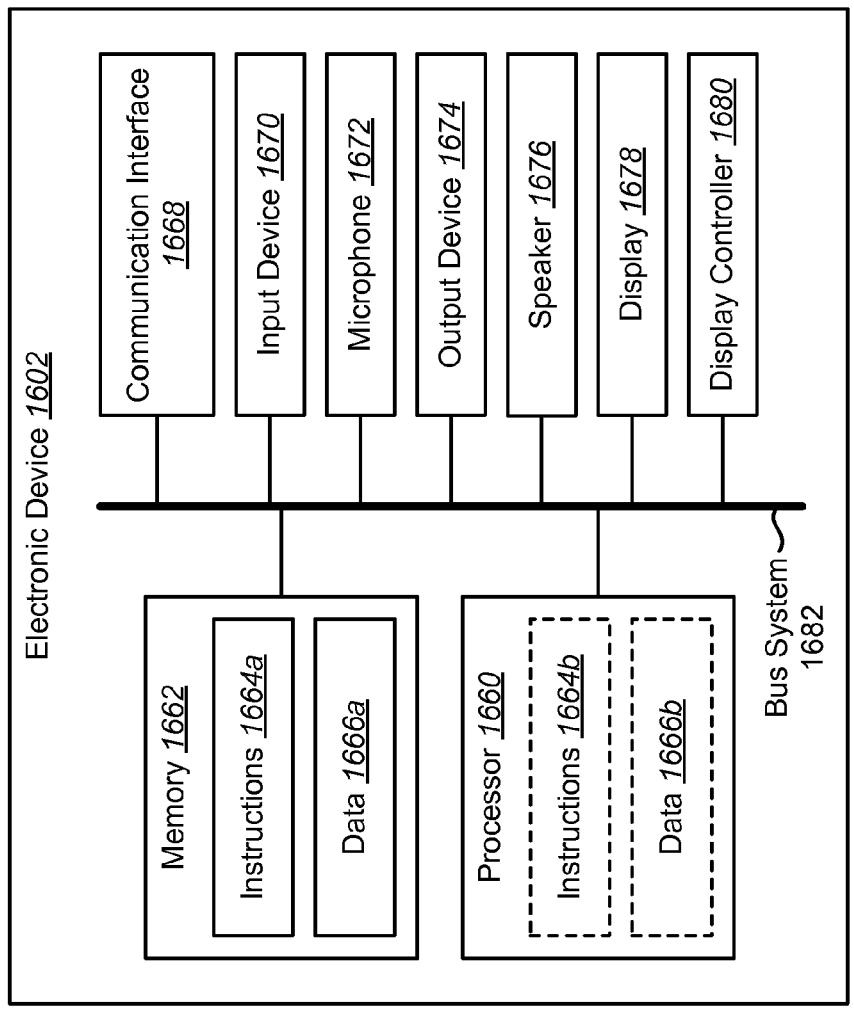
FIG. 16 illustrates various components that may be utilized in an electronic device.

FIG. 16 illustrates various components that may be utilized in an electronic device 1602. The illustrated components may be located within the same physical structure or in separate housings or structures. The electronic device 1602 described in connection with FIG. 16 may be implemented in accordance with one or more of the electronic devices 102, 402 described herein.

The electronic device 1602 includes a processor 1660. The processor 1660 may be a general purpose single- or multi-chip microprocessor (e.g., an ARM), a special purpose microprocessor (e.g., a digital signal processor (DSP)), a microcontroller, a programmable gate array, etc. The processor 1660 may be referred to as a central processing unit (CPU). Although just a single processor 1660 is shown in the electronic device 1602 of FIG. 16, in an alternative configuration, a combination of processors 1660 (e.g., an ARM and DSP) could be used.

The electronic device 1602 also includes memory 1662 in electronic communication with the processor 1660. That is, the processor 1660 may read information from and/or write information to the memory 1662. The memory 1662 may be any electronic component capable of storing electronic information. The memory 1662 may be random access memory (RAM), read-only memory (ROM), magnetic disk storage media, optical storage media, flash memory devices in RAM, on-board memory included with the processor 1660, programmable read-only memory (PROM), erasable programmable read-only memory (EPROM), electrically erasable PROM (EEPROM), registers, and so forth, including combinations thereof.

Data 1666a and instructions 1664a may be stored in the memory 1662. The instructions 1664a may include one or more programs, routines, sub-routines, functions, procedures, etc. The instructions may include a single computer-readable statement or many computer-readable statements.

The instructions 1664a may be executable by the processor 1660 to implement one or more of the methods, functions and procedures described above. Executing the instructions may involve the use of the data 1666a that is stored in the memory 1662. FIG. 16 shows some instructions 1664b and data 1666b being loaded into the processor 1660 (which may come from instructions 1664a and data 1666a that are stored in the memory 1662).

The electronic device 1602 may also include one or more communication interfaces 1668 for communicating with other electronic devices. The communication interfaces 1668 may be based on wired communication technology, wireless communication technology, or both. Examples of different types of communication interfaces 1668 include a serial port, a parallel port, a Universal Serial Bus (USB), an Ethernet adapter, an Institute of Electrical and Electronics Engineers (IEEE) 1394 bus interface, a near-field communication (NFC) transceiver, a small computer system interface (SCSI) bus interface, an infrared (IR) communication port, a Bluetooth wireless communication adapter, a 3rd Generation Partnership Project (3GPP) transceiver, an IEEE 802.11 ("Wi-Fi") transceiver and so forth. For example, the communication interface 1668 may be coupled to one or more antennas (not shown) for transmitting and receiving wireless signals.

The electronic device 1602 may also include one or more input devices 1670 and one or more output devices 1674. Examples of different kinds of input devices 1670 include a keyboard, mouse, microphone 1672, remote control device, button, joystick, trackball, touchpad, lightpen, etc. For instance, the electronic device 1602 may include one or more microphones 1672 for capturing acoustic signals. In one configuration, a microphone 1672 may be a transducer that converts acoustic signals (e.g., voice, speech) into electrical or electronic signals. Examples of different kinds of output devices 1674 include a speaker 1676, printer, etc. For instance, the electronic device 1602 may include one or more speakers 1676. In one configuration, a speaker 1676 may be a transducer that converts electrical or electronic signals into acoustic signals. One specific type of output device 1674 that may be typically included in an electronic device 1602 is a display 1678 device. Display 1678 devices used with configurations disclosed herein may utilize any suitable image projection technology, such as a cathode ray tube (CRT), liquid crystal display (LCD), light-emitting diode (LED), gas plasma, electroluminescence, or the like. A display controller 1680 may also be provided, for converting data stored in the memory 1662 into text, graphics, and/or moving images (as appropriate) shown on the display 1678 device.

The various components of the electronic device 1602 may be coupled together by one or more buses, which may include a power bus, a control signal bus, a status signal bus, a data bus, etc. For simplicity, the various buses are illustrated in FIG. 16 as a bus system 1682. It should be noted that FIG. 16 illustrates only one possible configuration of an electronic device 1602. Various other architectures and components may be utilized.

In the above description, reference numbers have sometimes been used in connection with various terms. Where a term is used in connection with a reference number, this may be meant to refer to a specific element that is shown in one or more of the Figures. Where a term is used without a reference number, this may be meant to refer generally to the term without limitation to any particular Figure.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a digital signal processor (DSP) and a microprocessor, a plurality of microprocessors, one or more microprocessors in conjunction with a digital signal processor (DSP) core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The functions described herein may be implemented in software or firmware being executed by hardware. The functions may be stored as one or more instructions on a computer-readable medium. The terms "computer-readable medium" or "computer-program product" refers to any tangible storage medium that can be accessed by a computer or a processor. By way of example, and not limitation, a computer-readable medium may include RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 2, FIG. 3, FIG. 6 and FIG. 7, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for setting an initial gain and an initial offset for an automatic gain and offset controller, comprising:
   determining a gain level at which a signal does not under-saturate or over-saturate an input to an analog-to-digital converter by performing a binary search over a fixed set of gain levels while an offset is fixed, wherein the offset is nonzero; and
   determining an offset correction to bring an unmodulated carrier level at an output of the analog-to-digital converter to a target level.

2. The method of claim 1, wherein the fixed set of gain levels are logarithmically spaced.

3. The method of claim 2, wherein the fixed set of gain levels are determined to have sufficient overlap to provide tolerance to gain variation.

4. The method of claim 1, wherein determining the offset correction comprises:
   determining a difference of the unmodulated carrier level and the target level; and
   adjusting the offset correction by the difference.

5. The method of claim 1, further comprising setting an initial gain and an initial offset when an input carrier signal at a receiving antenna is unmodulated.

6. The method of claim 1, wherein the automatic gain and offset controller is for a near field communication target receiver.

7. The method of claim 1, further comprising updating the gain and the offset in response to changes in a signal level, wherein the updating the gain and the offset comprises:
determining an offset correction to maintain the unmodulated carrier level at the output to the analog-to-digital converter at the target level until signal reception ends; and
determining whether a gain change is needed.

8. The method of claim 7, wherein determining whether the gain change is needed comprises:
determining a deviation of an updated offset from an initial offset;
decreasing the gain if the deviation is above a first offset deviation threshold; and
increasing the gain if the deviation is below a second offset deviation threshold.

9. The method of claim 7, wherein the updating the gain and the offset takes place when an input carrier signal at a receiving antenna is modulated or unmodulated.

10. An electronic device for setting an initial gain and an initial offset for an automatic gain and offset controller, comprising:
a processor;
memory in electronic communication with the processor; and
instructions stored in the memory, the instructions being executable by the processor to:
determine a gain level at which a signal does not under-saturate or over-saturate an input to an analog-to-digital converter by performing a binary search over a fixed set of gain levels while an offset is fixed, wherein the offset is nonzero; and
determine an offset correction to bring an unmodulated carrier level at an output of the analog-to-digital converter to a target level.

11. The electronic device of claim 10, wherein the fixed set of gain levels are logarithmically spaced.

12. The electronic device of claim 11, wherein the fixed set of gain levels are determined to have sufficient overlap to provide tolerance to gain variation.

13. The electronic device of claim 10, wherein the instructions executable to determine the offset correction comprise instructions executable to:
determine a difference of the unmodulated carrier level and the target level; and
adjust the offset correction by the difference.

14. The electronic device of claim 10, wherein the instructions are further executable to set an initial gain and an initial offset when an input carrier signal at a receiving antenna is unmodulated.

15. The electronic device of claim 10, wherein the automatic gain and offset controller is for a near field communication target receiver.

16. The electronic device of claim 10, further comprising instructions executable to update the gain and the offset in response to changes in a signal level, wherein the instructions executable to update the gain and the offset comprise instructions executable to:
determine an offset correction to maintain the unmodulated carrier level at the output to the analog-to-digital converter at the target level until signal reception ends; and
determine whether a gain change is needed.

17. The electronic device of claim 16, wherein the instructions executable to determine whether the gain change is needed comprise instructions executable to:
determine a deviation of an updated offset from an initial offset;
decrease the gain if the deviation is above a first offset deviation threshold; and
increase the gain if the deviation is below a second offset deviation threshold.

18. The electronic device of claim 16, wherein the updating the gain and the offset takes place when an input carrier signal at a receiving antenna is modulated or unmodulated.

19. An apparatus for setting an initial gain and an initial offset for an automatic gain and offset controller, comprising:
means for determining a gain level at which a signal does not under-saturate or over-saturate an input to an analog-to-digital converter by performing a binary search over a fixed set of gain levels while an offset is fixed, wherein the offset is nonzero; and
means for determining an offset correction to bring an unmodulated carrier level at an output of the analog-to-digital converter to a target level.

20. The apparatus of claim 19, wherein the fixed set of gain levels are logarithmically spaced.

21. The apparatus of claim 19, wherein the means for determining the offset correction comprise:
means for determining a difference of the unmodulated carrier level and the target level; and
means for adjusting the offset correction by the difference.

22. The apparatus of claim 19, further comprising means for setting an initial gain and an initial offset when an input carrier signal at a receiving antenna is unmodulated.

23. The apparatus of claim 19, further comprising means for updating the gain and the offset in response to changes in a signal level, wherein the means for updating the gain and the offset comprise:
means for determining an offset correction to maintain the unmodulated carrier level at the output to the analog-to-digital converter at the target level until signal reception ends; and
means for determining whether a gain change is needed.

24. The apparatus of claim 23, wherein the means for determining whether the gain change is needed comprise:
means for determining a deviation of an updated offset from an initial offset;
means for decreasing the gain if the deviation is above a first offset deviation threshold; and
means for increasing the gain if the deviation is below a second offset deviation threshold.

25. A non-transitory computer-readable medium having instructions thereon, the instructions comprising:
code for causing an apparatus to determine a gain level at which a signal does not under-saturate or over-saturate an input to an analog-to-digital converter by performing a binary search over a fixed set of gain levels while an offset is fixed, wherein the offset is nonzero; and
code for causing the apparatus to determine an offset correction to bring an unmodulated carrier level at an output of the analog-to-digital converter to a target level.

26. The non-transitory computer-readable medium of claim 25, wherein the fixed set of gain levels are logarithmically spaced.

27. The non-transitory computer-readable medium of claim 25, wherein the code for causing the apparatus to determine the offset correction comprises:

code for causing the apparatus to determine a difference of the unmodulated carrier level and the target level; and code for causing the apparatus to adjust the offset correction by the difference.

28. The non-transitory computer-readable medium of claim 25, further comprising code for causing the apparatus to set an initial gain and an initial offset when an input carrier signal at a receiving antenna is unmodulated.

29. The non-transitory computer-readable medium of claim 25, further comprising code for causing the apparatus to update the gain and the offset in response to changes in a signal level, wherein the code for causing the apparatus to update the gain and the offset comprises:

code for causing the apparatus to determine an offset correction to maintain the unmodulated carrier level at the output to the analog-to-digital converter at the target level until signal reception ends; and code for causing the apparatus to determine whether a gain change is needed.

30. The non-transitory computer-readable medium of claim 29, wherein the code for causing the apparatus to determine whether the gain change is needed comprises:

code for causing the apparatus to determine a deviation of an updated offset from an initial offset;

code for causing the apparatus to decrease the gain if the deviation is above a first offset deviation threshold; and code for causing the apparatus to increase the gain if the deviation is below a second offset deviation threshold.

* * * * *